United States Patent
Kim et al.

(10) Patent No.: US 12,279,427 B2
(45) Date of Patent: Apr. 15, 2025

(54) SEMICONDUCTOR DEVICE AND METHOD OF FABRICATING THE SAME

(71) Applicant: SAMSUNG ELECTRONICS CO., LTD., Suwon-si (KR)

(72) Inventors: Na-Young Kim, Seoul (KR); Seongho Kim, Seoul (KR); Hoonmin Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 417 days.

(21) Appl. No.: 17/750,586

(22) Filed: May 23, 2022

(65) Prior Publication Data

US 2023/0084281 A1 Mar. 16, 2023

(30) Foreign Application Priority Data

Sep. 16, 2021 (KR) .......................... 10-2021-0123994

(51) Int. Cl.
*H10B 41/42* (2023.01)
*H10B 41/41* (2023.01)

(52) U.S. Cl.
CPC ............. *H10B 41/42* (2023.02); *H10B 41/41* (2023.02)

(58) Field of Classification Search
CPC ........ H10B 41/42; H10B 41/41; H10B 12/09; H10B 12/50; H10B 12/34
See application file for complete search history.

(56) References Cited

U.S. PATENT DOCUMENTS

| | | | |
|---|---|---|---|
| 8,653,666 B2 | 2/2014 | Kawakita | |
| 8,883,622 B2 | 11/2014 | Park et al. | |
| 8,906,763 B2 | 12/2014 | Park et al. | |
| 10,043,809 B1 | 8/2018 | Chang et al. | |
| 10,074,656 B1 | 9/2018 | Wang et al. | |
| 11,393,825 B2 | 7/2022 | Choi et al. | |
| 2019/0067294 A1* | 2/2019 | Lee | H10B 12/315 |
| 2021/0151439 A1* | 5/2021 | Choi | H10B 12/033 |
| 2022/0093610 A1* | 3/2022 | Kim | H01L 23/53228 |

FOREIGN PATENT DOCUMENTS

| | | |
|---|---|---|
| KR | 10-1043408 | 6/2011 |
| KR | 10-1824735 | 2/2018 |
| KR | 10-2021-0024506 | 3/2021 |
| KR | 10-2021-0047032 | 4/2021 |

* cited by examiner

*Primary Examiner* — Evan G Clinton
*Assistant Examiner* — Corbyn D Mellinger
(74) *Attorney, Agent, or Firm* — F. CHAU & ASSOCIATES, LLC

(57) ABSTRACT

A semiconductor device includes a substrate including cell and peripheral regions. Landing pads and contact plugs are on the cell and peripheral regions, respectively. A first filler pattern fills regions between the landing pads and between the contact plugs. Outer voids are in the first filler pattern and include first and second outer voids on the cell and peripheral regions, respectively. A second filler pattern covers the first filler pattern and the contact plugs and fills at least a portion of the second outer void. An inner void is in the second outer void and enclosed by the second filler pattern. The first and second filler patterns include the same material. On the cell region, at least a portion of the second filler pattern is located below top surfaces of the landing pads, and a bottom surface of the second filler pattern is partially exposed by the first outer void.

10 Claims, 26 Drawing Sheets

SEMICONDUCTOR DEVICE AND METHOD OF FABRICATING THE SAME

CROSS-REFERENCE TO RELATED APPLICATIONS

This application claims priority under 35 U.S.C. § 119 to Korean Patent Application No. 10-2021-0123994, filed on Sep. 16, 2021 in the Korean Intellectual Property Office, the disclosure of which is incorporated by reference in its entirety herein.

1. TECHNICAL FIELD

The present disclosure relates to a semiconductor device and a method of fabricating the same, and in particular, to a semiconductor device including a filler pattern, which is provided between landing pads and between contact plugs, and a method of fabricating the same.

2. DISCUSSION OF RELATED ART

Semiconductor devices have become increasingly important in the electronics industry due to their small-size, multifunctional capabilities, and cost efficiency. Semiconductor devices may be classified into a semiconductor memory device for storing data, a semiconductor logic device for processing data, and a hybrid semiconductor device including both memory and logic elements.

With the recent trend of high speed and low power consumption of electronic devices, semiconductor devices embedded in the electronic devices should also provide high operating speeds and/or low operating voltages. Therefore, there is an increased demand for semiconductor devices having a high integration density. However, the increase of the integration density of the semiconductor device may cause an increase of the complexity or failure rate in a process of fabricating a semiconductor device. For example, the higher the integration density of the semiconductor device, the lower the production yield and operation characteristics of the semiconductor device. Accordingly, many studies are being conducted to increase the production yield and operation reliability of the semiconductor device.

SUMMARY

An embodiment of the present inventive concept provides a method of preventing or suppressing patterns under a capacitor from being etched in a process of forming the capacitor of a semiconductor device and a semiconductor device fabricated thereby.

An embodiment of the present inventive concept provides a semiconductor device with increased reliability and a method of fabricating the same.

According to an embodiment of the present inventive concept, a semiconductor device includes a substrate including a cell region and a peripheral region. Landing pads are disposed on the cell region and spaced apart from each other in first and second directions that are parallel to a top surface of the substrate and are non-parallel to each other. Contact plugs are disposed on the peripheral region and spaced apart from each other in the first and second directions. A first filler pattern is arranged to fill regions between the landing pads and between the contact plugs. Outer voids are disposed in the first filler pattern. The outer voids include a first outer void on the cell region and a second outer void on the peripheral region. A second filler pattern is arranged to cover the first filler pattern and the contact plugs and to fill at least a portion of the second outer void. An inner void is positioned in the second outer void and enclosed by the second filler pattern. The first filler pattern comprises a same material as the second filler pattern. At least a portion of the second filler pattern on the cell region is located at a level lower than top surfaces of the landing pads. A portion of a bottom surface of the second filler pattern on the cell region is exposed by the first outer void.

According to an embodiment of the present inventive concept, a method of fabricating a semiconductor device includes forming a contact layer on a substrate including a cell region and a peripheral region. The contact layer is etched to form landing pads on the cell region and to form contact plugs on the peripheral region. A first filler layer is formed to fill regions between the landing pads and between the contact plugs. The first filler layer comprises outer voids disposed therein. The outer voids comprise a first outer void on the cell region and a second outer void on the peripheral region. An upper portion of the first filler layer is etched to form a first filler pattern and to expose the first outer void. A second filler pattern is formed to cover the first filler pattern, the first outer void, the landing pads, and the contact plugs, to fill a portion of the second outer void, and to form an inner void in the second outer void. An etching process is performed to etch at least a portion of an upper portion of the second filler pattern on the cell region. The first filler pattern comprises a same material as the second filler pattern.

DETAILED DESCRIPTION OF EMBODIMENTS

Non-limiting, example embodiments of the present inventive concept will now be described more fully with reference to the accompanying drawings.

Figure 1:
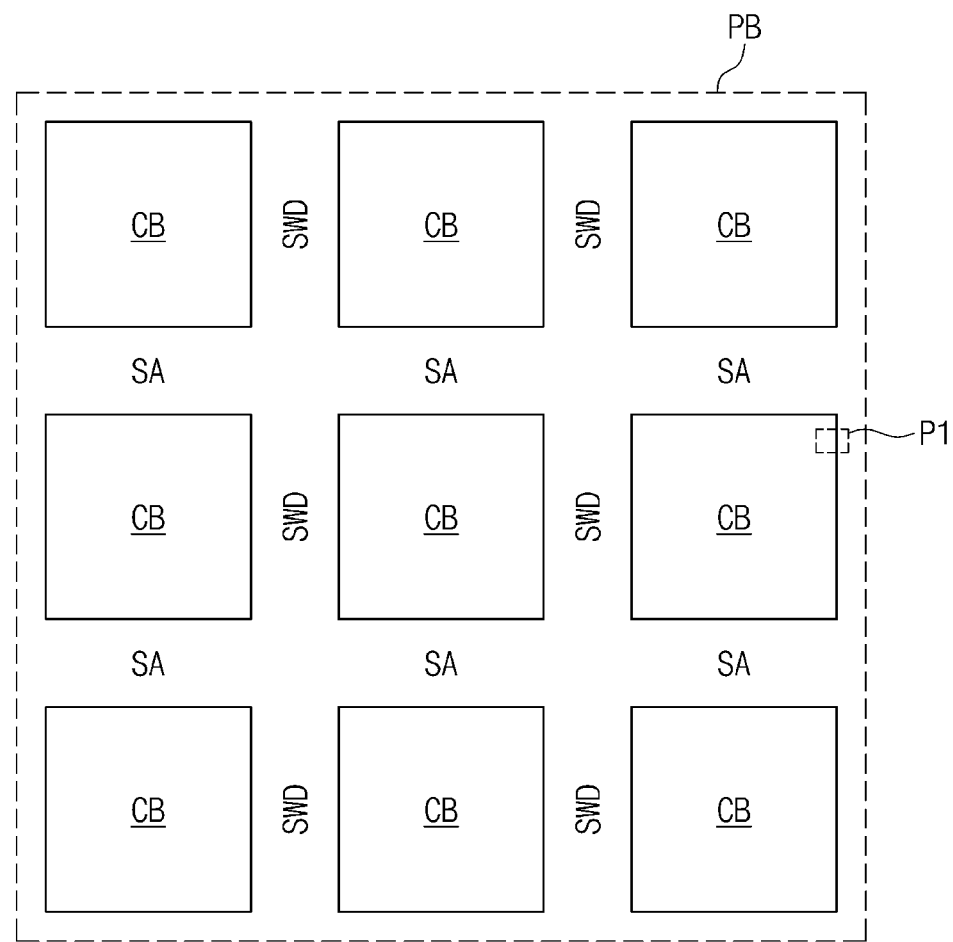
FIG. 1 is a block diagram illustrating a semiconductor device according to an embodiment of the present inventive concept.

FIG. 1 is a block diagram illustrating a semiconductor device according to an embodiment of the present inventive concept.

Referring to an embodiment of FIG. 1, a semiconductor device may include cell blocks CB and a peripheral block PB, which is arranged to surround each of the cell blocks CB. In an embodiment, the semiconductor device may be a memory device, and each of the cell blocks CB may include a cell circuit (e.g., an integrated memory circuit). The peripheral block PB may include various peripheral circuits, which are used to operate the cell circuit, and such peripheral circuits may be electrically connected to the cell circuit.

In an embodiment, the peripheral block PB may include sense amplifier circuits SA and sub-word line driver circuits SWD. In an embodiment as shown in FIG. 1, the sense amplifier circuits SA may be arranged to face each other with the cell blocks CB interposed therebetween, and the sub-word line driver circuits SWD may be arranged to face each other with the cell blocks CB interposed therebetween. The peripheral block PB may further include power and ground circuits, which are used to drive a sense amplifier. However, embodiments of the present inventive concept are not necessarily limited thereto.

Figure 2:
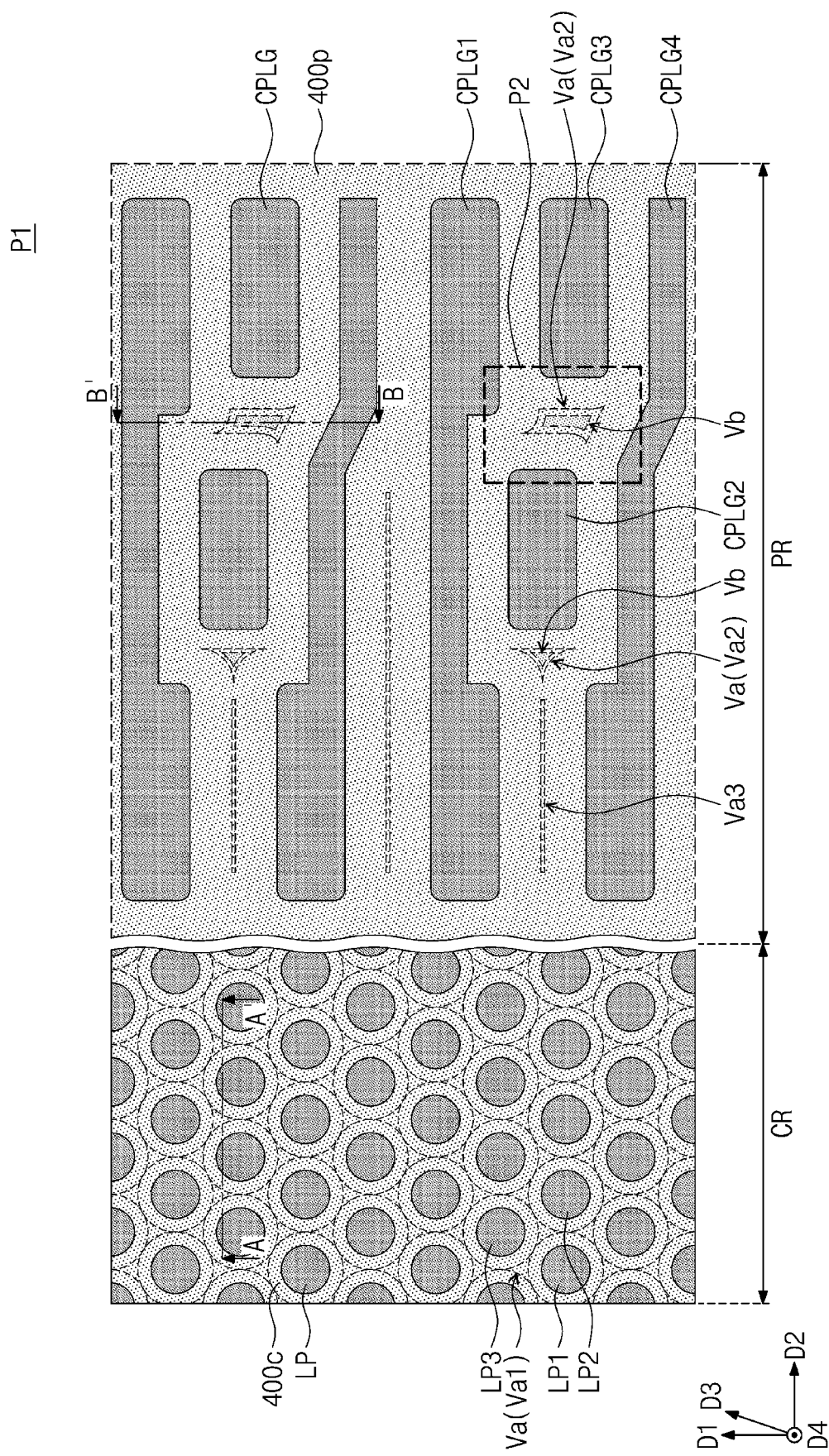
FIG. 2 is a plan view illustrating a semiconductor device according to an embodiment of the present inventive concept and corresponding to a portion 'P1' of FIG. 1.
Figure 3A:
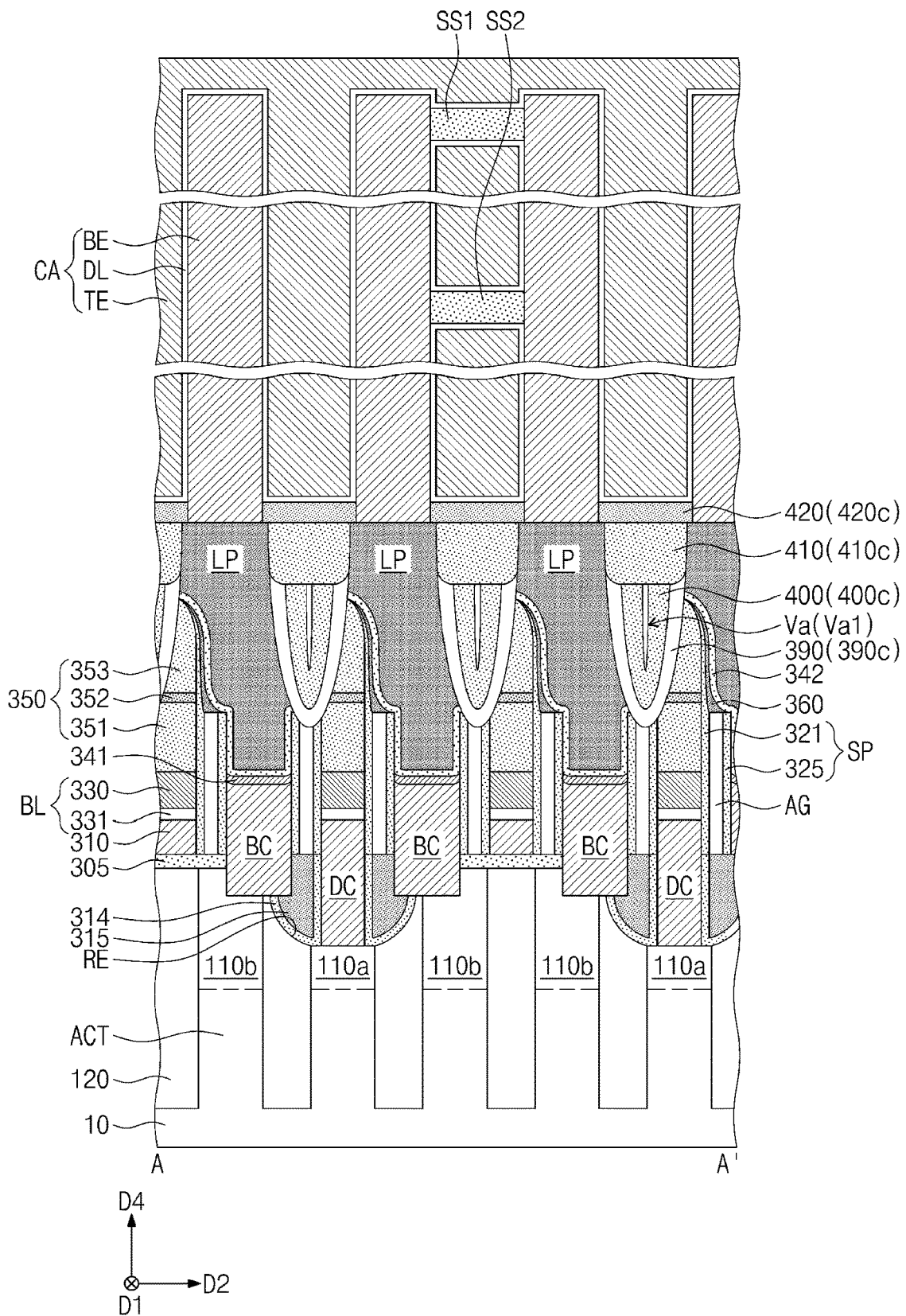
FIGS. 3A, 5, and 6 are cross-sectional views of a semiconductor device taken along a line A-A' of FIG. 2 according to embodiments of the present inventive concept.
Figure 3B:
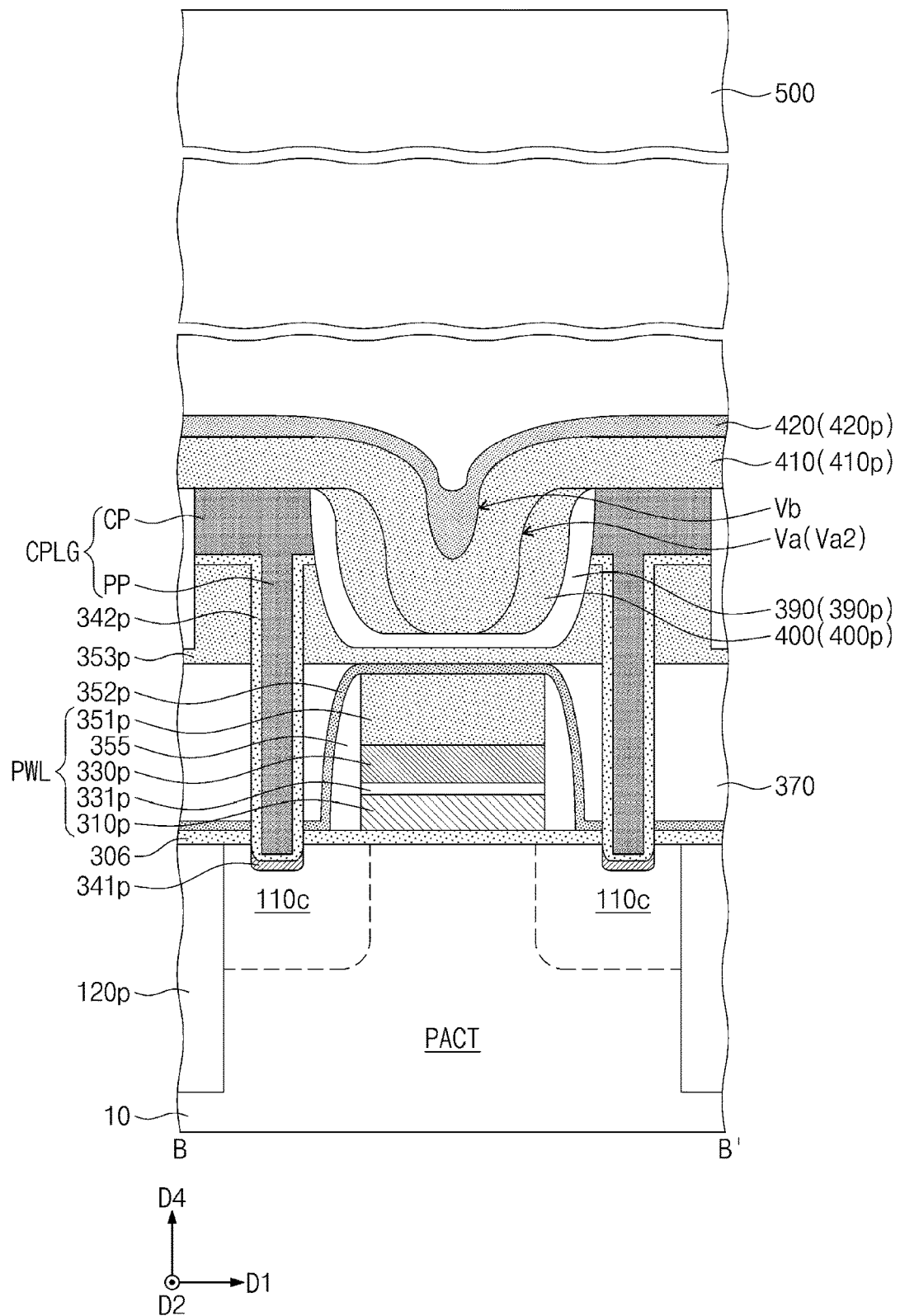
FIGS. 3B and 7 are cross-sectional views of a semiconductor device taken along a line B-B' of FIG. 2 according to embodiments of the present inventive concept.

FIG. 2 is a plan view illustrating a semiconductor device according to an embodiment of the present inventive concept and corresponding to a portion 'P1' of FIG. 1. FIGS. 3A and 3B are cross-sectional views which are respectively taken along lines A-A' and B-B' of FIG. 2.

Referring to an embodiment of FIG. 2, a substrate 10 may include a cell region CR and a peripheral region PR. In an embodiment, the substrate 10 may be a semiconductor substrate (e.g., a silicon substrate, a germanium substrate, or a silicon-germanium substrate). The cell region CR may be a region of the substrate 10 on which each cell block CB of FIG. 1 is disposed thereon, and the peripheral region PR may be another region of the substrate 10, on which the peripheral block PB of FIG. 1 is disposed thereon.

Referring to embodiments of FIGS. 2 and 3A, cell active patterns ACT may be disposed on the cell region CR of the substrate 10. In an embodiment, when viewed in a plan view, the cell active patterns ACT may be spaced apart from each other in a first direction D1 and a second direction D2. The first and second directions D1 and D2 may be parallel to a top surface of the substrate 10 and may be non-parallel (e.g., orthogonal) to each other. In an embodiment, the cell active patterns ACT may be bar-shaped patterns extending in a third direction D3, which is parallel to the top surface of the substrate 10 and is not parallel to (e.g., crosses) the first and second directions D1 and D2. An end portion of one of the cell active patterns ACT may be positioned adjacent to a center of another of the cell active patterns ACT adjacent thereto in the second direction D2. Each of the cell active patterns ACT may be a protruding portion of the substrate 10 which is extended in a fourth direction D4 perpendicular to the top surface of the substrate 10.

Device isolation layers 120 may be disposed between the cell active patterns ACT on the cell region CR. The device isolation layers 120 may be disposed in the substrate 10 to define the cell active patterns ACT. In an embodiment, the device isolation layers 120 may be formed of or include at least one compound selected from silicon oxide, silicon nitride, and silicon oxynitride.

In an embodiment, word lines may be disposed on the cell region CR to cross the cell active patterns ACT and the device isolation layers 120. For example, the word lines may be disposed in grooves, which are formed in the cell active patterns ACT and the device isolation layers 120. The word lines may be extended in the second direction D2 and may be spaced apart from each other in the first direction D1. The word lines may be buried in the substrate 10.

Impurity regions may be provided in the cell active patterns ACT. The impurity regions may include first impurity regions 110a and second impurity regions 110b. The second impurity regions 110b may be arranged in opposite edge regions of each of the cell active patterns ACT. In an embodiment, each of the first impurity regions 110a may be interposed between two adjacent second impurity regions 110b in each of the cell active patterns ACT. The first impurity regions 110a and the second impurity regions 110b may contain impurities of the same conductivity type (e.g., n-type).

A buffer pattern 305 may be disposed on the cell region CR of the substrate 10. The buffer pattern 305 may cover the cell active patterns ACT, the device isolation layers 120, and the word lines. In an embodiment, the buffer pattern 305 may be formed of or include at least one compound selected from silicon oxide, silicon nitride, and silicon oxynitride.

Bit lines BL may be disposed on the cell region CR. In an embodiment, the bit lines BL may extend in the first direction D1 and may be spaced apart from each other in the second direction D2. Each of the bit lines BL may include a first ohmic pattern 331 and a metal-containing pattern 330, which are sequentially stacked (e.g., in the fourth direction D4). In an embodiment, the first ohmic pattern 331 may be formed of or include at least one of metal silicide materials. The metal-containing pattern 330 may be formed of or include at least one of metallic materials (e.g., tungsten, titanium, tantalum, and the like).

Polysilicon patterns 310 may be interposed between the bit lines BL and the buffer pattern 305 (e.g., in the fourth direction D4).

Bit line contacts DC may be respectively interposed between the bit lines BL and the first impurity regions 110a (e.g., in the fourth direction D4). The bit lines BL may be electrically connected to the first impurity regions 110a by the bit line contacts DC. In an embodiment, the bit line contacts DC may be formed of or include doped or undoped polysilicon.

The bit line contacts DC may be disposed in recess regions RE. The recess region RE may be positioned in upper portions of the first impurity regions 110a and the device isolation layers 120, which are adjacent to each other. A first gapfill insulating pattern 314 and a second gapfill insulating pattern 315 may be arranged to fill a remaining portion of the recess region RE that is not filled by the bit line contacts DC.

A capping pattern 350 may be disposed on a top surface of each of the bit lines BL. The capping pattern 350 may extend in the first direction D1 on each of the bit lines BL, and may be spaced apart from each other in the second direction D2. In an embodiment, the capping pattern 350 may include a first capping pattern 351, a second capping pattern 352, and a third capping pattern 353. The capping pattern 350 may be formed of or include silicon nitride. For example, in an embodiment, the first capping pattern 351, the second capping pattern 352, and the third capping pattern 353 may be formed of or include silicon nitride.

A bit line spacer SP may be arranged to cover a lateral side surface of each of the polysilicon patterns 310, an upper portion of a lateral side surface of each of the bit line contacts DC, a lateral side surface of each of the bit lines BL, and a lateral side surface of the capping pattern 350. On each of the bit lines BL, the bit line spacer SP may extend in the first direction D1.

The bit line spacer SP may include a first sub-spacer 321 and a second sub-spacer 325, which are spaced apart from each other (e.g., in the second direction D2). As an example, as shown in an embodiment of FIG. 3A, the first sub-spacer 321 and the second sub-spacer 325 may be spaced apart from each other by an air gap AG. The first sub-spacer 321 may be in direct contact with a lateral side surface of each of the bit lines BL and may extend to a lateral side surface of the capping pattern 350. The second sub-spacer 325 may be arranged along a side surface of the first sub-spacer 321. In an embodiment, the first sub-spacer 321 and the second sub-spacer 325 may be formed of or include at least one compound selected from silicon nitride, silicon oxide, and silicon oxynitride and may have a single- or multi-layered structure. The first sub-spacer 321 and the second sub-spacer 325 may be formed of or include the same material.

A fourth capping pattern 360 may be arranged to cover the lateral side surface of the first sub-spacer 321 and may extend to cover a top surface of the second sub-spacer 325. The fourth capping pattern 360 may further cover the air gap AG.

Storage node contacts BC may be interposed between adjacent bit lines BL (e.g., in the second direction D2). The bit line spacer SP may be interposed between the storage node contacts BC and the bit lines BL which are adjacent to each other (e.g., in the second direction D2). The storage node contacts BC may be spaced apart from each other in the first and second directions D1 and D2. Each of the storage node contacts BC may be electrically connected to a corresponding one of the second impurity regions 110b. The storage node contacts BC may be formed of or include doped or undoped polysilicon.

Second ohmic patterns 341 may be disposed on the storage node contacts BC, respectively. The second ohmic patterns 341 may be formed of or include at least one of metal silicide materials.

A diffusion prevention pattern 342 may conformally cover the second ohmic pattern 341, the bit line spacer SP, and the capping pattern 350. The diffusion prevention pattern 342 may be formed of or include at least one of metal nitrides (e.g., titanium nitride and tantalum nitride). Each of the second ohmic patterns 341 may be interposed between the diffusion prevention pattern 342 and a corresponding one of the storage node contacts BC (e.g., in the fourth direction D4).

Landing pads LP may be disposed on the storage node contacts BC, respectively. The landing pads LP may be formed of or include a metal-containing material (e.g., tungsten). Upper portions of the landing pads LP may be shifted from (e.g., not aligned with) the storage node contacts BC in the second direction D2. When viewed in a plan view, the landing pads LP may be spaced apart from each other in the first and second directions D1 and D2. As an example, in an embodiment, the landing pads LP may be spaced apart from each other in the first and second directions D1 and D2 in a zigzag shape. For example, in an embodiment, a pair of the landing pads LIP, which are most adjacent to each other in the first direction D1, may be arranged to be shifted from each other in the second direction D2.

Referring to embodiments of FIGS. 2 and 3B, peripheral active patterns PACT may be disposed on the peripheral region PR of the substrate 10. Peripheral device isolation layers 120p may be disposed between the peripheral active patterns PACT on the peripheral region PR. The peripheral device isolation layers 120p may be disposed in the substrate 10 to define the peripheral active patterns PACT. Peripheral impurity regions 110c may be provided in the peripheral active patterns PACT.

A peripheral gate dielectric pattern 306 and a peripheral word line PWL may be disposed on the peripheral active patterns PACT. The peripheral gate dielectric pattern 306 and the peripheral word line PWL may be sequentially stacked on the peripheral active patterns PACT (e.g., in the fourth direction D4). The peripheral gate dielectric pattern 306 may extend to regions on the peripheral device isolation layers 120p.

The peripheral word line PWL may be disposed to cross the peripheral active patterns PACT. In an embodiment, the peripheral word line PWL may include a peripheral polysilicon pattern 310p, a first peripheral ohmic pattern 331p, a peripheral metal-containing pattern 330p, a first peripheral capping pattern 351p, and a peripheral spacer 355. The peripheral polysilicon pattern 310p, the first peripheral ohmic pattern 331p, the peripheral metal-containing pattern 330p, and the first peripheral capping pattern 351p may be sequentially stacked on the peripheral gate dielectric pattern 306 (e.g., in the fourth direction D4).

In an embodiment, the peripheral polysilicon pattern 310p, the first peripheral ohmic pattern 331p, the peripheral metal-containing pattern 330p, and the first peripheral capping pattern 351p may be respectively formed of or include the same materials as the polysilicon pattern 310, the first ohmic pattern 331, the metal-containing pattern 330, and the first capping pattern 351 of FIG. 3A and may be arranged to cross the peripheral active pattern PACT. The peripheral spacer 355 may be disposed on a lateral side surface of the peripheral polysilicon pattern 310p, a lateral side surface of the first peripheral ohmic pattern 331p, a lateral side surface of the peripheral metal-containing pattern 330p, and a lateral side surface of the first peripheral capping pattern 351p.

A lower insulating pattern 370 may be disposed on a lateral side surface of the peripheral word line PWL. For example, the lower insulating pattern 370 may enclose the lateral side surfaces of the peripheral word line PWL. In an embodiment, the lower insulating pattern 370 may be formed of or include silicon oxide.

A second peripheral capping pattern 352p may be arranged to cover a top surface of the peripheral word line PWL and may extend with a substantially uniform thickness along a lateral side surface of the peripheral spacer 355 and a top surface of the peripheral gate dielectric pattern 306. The second peripheral capping pattern 352p may be interposed between the lateral side surface of the peripheral word line PWL and the lower insulating pattern 370 and between the substrate 10 and the lower insulating pattern 370. In an embodiment, the second peripheral capping pattern 352p may be formed of or include the same material as the second capping pattern 352.

A third peripheral capping pattern 353p may be disposed on the lower insulating pattern 370 and the peripheral word line PWL. The third peripheral capping pattern 353p may cover the lower insulating pattern 370. In an embodiment, the third peripheral capping pattern 353p may be formed of or include the same material as the third capping pattern 353.

Contact plugs CPLG may be disposed on the peripheral region PR. The contact plugs CPLG may be spaced apart from each other in the first and second directions D1 and D2. Each of the contact plugs CPLG may include a contact pad CP and a penetration plug PP, which is disposed below the contact pad CP and extends toward the substrate 10 (e.g., in the fourth direction D4). The contact pad CP may be disposed on the third peripheral capping pattern 353p. A portion of the penetration plugs PP may extend in the fourth direction D4 to penetrate the third peripheral capping pattern 353p, the lower insulating pattern 370, the peripheral gate dielectric pattern 306, and an upper portion of the substrate 10. The upper portion of the substrate 10 may be a region, in which the peripheral impurity regions 110c are provided. A second peripheral ohmic pattern 341p may be interposed between the lower portion of the penetration plugs PP and the upper portion of the substrate 10 (e.g., in the fourth direction D4). A peripheral diffusion prevention pattern 342p may be arranged to enclose the penetration plug PP and may be interposed between a bottom surface of the contact pad CP and the third peripheral capping pattern 353p. The contact plugs CPLG may be formed of or include the same material as the landing pads LP. In an embodiment, the contact plugs CPLG may be formed of or include a metal-containing material (e.g., tungsten).

In an embodiment, another one of the penetration plugs PP may extend in the fourth direction D4 to penetrate the third peripheral capping pattern 353p and the peripheral metal-containing pattern 330p and may be electrically connected to the peripheral metal-containing pattern 330p.

Referring to embodiments of FIGS. 2, 3A, and 3B, a first filler pattern 400 may be arranged to fill regions between the landing pads LP and between the contact plugs CPLG. The first filler pattern 400 may include a first filler pattern 400c in the cell region CR, which has a shape corresponding to a profile of a lateral side surface of the landing pads LP, and a first filler pattern 400p in the peripheral region PR, which has a shape corresponding to a profile of a lateral side surface of the contact plugs CPLG. In an embodiment, the first filler pattern 400 may be formed of or include silicon nitride.

A wrapping pattern 390 may be further interposed between the first filler pattern 400c and the landing pads LP and between the first filler pattern 400p and the contact plugs CPLG. The wrapping pattern 390 may be arranged to wrap a portion of the lateral side surface of the landing pads LP and a portion of the lateral side surface of the contact plugs CPLG, and the first filler pattern 400 may be arranged to wrap an inner side surface of the wrapping pattern 390.

Outer voids Va may be disposed in the first filler pattern 400. The outer voids Va may be disposed between two or more landing pads LP or between two or more contact plugs CPLG.

The outer voids Va may include first outer voids Va1, which are positioned on the cell region CR between two or more landing pads LP. For example, as shown in an embodiment of FIG. 2, the landing pads LP may include a first landing pad LP1 and a second landing pad LP2, which are most adjacent to each other in the second direction D2, and a third landing pad LP3, which is most adjacent to both of the first and second landing pad LP1 and LP2 in the first direction D1, and the first outer void Va1 may be disposed between the first, second and third landing pad LP1, LP2, and LP3. In an embodiment, the first outer void Va1 may be an empty region, which is positioned in and enclosed by the first filler pattern 400c.

The outer voids Va on the peripheral region PR may include second outer voids Va2 and third outer voids Va3, which are disposed between two or more contact plugs CPLG. Each of the second outer voids Va2 may be a region enclosed by the first filler pattern 400p, and an inner void Vb may be positioned in each of the second outer voids Va2. The third outer voids Va3 may be a region enclosed by the first filler pattern 400p, and the inner void Vb may not be disposed in each of the third outer voids Va3.

In an embodiment, at least one of the second outer voids Va2 may be disposed between four or more contact plugs CPLG that are adjacent to each other. For example, as shown in an embodiment of FIG. 2, such a second outer void Va2 may be disposed between the first, second, third, and fourth contact plugs CPLG1, CPLG2, CPLG3, and CPLG4, which are adjacent to each other. In an embodiment, at least one of the second outer voids Va2 may be disposed between three or more contact plugs CPLG, which are adjacent to each other. For example, as shown in an embodiment of FIG. 2, such a second outer void Va2 may be disposed between the first, second, and fourth contact plugs CPLG1, CPLG2, and CPLG4, which are adjacent to each other. However, embodiments of the present inventive concept are not necessarily limited to this example, and in an embodiment, the second outer voids Va2 may be disposed between two or more contact plugs CPLG.

A second filler pattern 410 may be arranged to cover the first filler pattern 400 and the contact plugs CPLG. In an embodiment, the second filler pattern 410 may be formed of or include the same material as the first filler pattern 400. For example, the second filler pattern 410 may be formed of or include silicon nitride.

The second filler pattern 410 may include a second filler pattern 410c, which is positioned on the cell region CR to cover the first outer void Va1 between the landing pads LP and extends along a top surface of the first filler pattern 400c and a top surface of the wrapping pattern 390c. A portion of a bottom surface of the second filler pattern 410c may be exposed by the first outer void Va1. For example, as shown in FIG. 3A, a central portion (e.g., in the second direction D2) of the bottom surface of the second filler pattern 410c may be exposed by the first outer void Va1. However, embodiments of the present inventive concept are not necessarily limited thereto. The portion of the bottom surface of the second filler pattern 410c may be located at a level (e.g., distance from an upper surface of the substrate 10 in the fourth direction D4) that is lower than a level of top surfaces of the landing pads LP and is higher than a level of top surface of the capping pattern 350. At least a portion of the second filler pattern 410c may be located at a level lower than the top surface of the landing pad LP and may be in direct contact with an upper side surface of the landing pad LP.

The second filler pattern 410 may include a second filler pattern 410p, which is positioned on the peripheral region PR to cover the first filler pattern 400p and extends to a top surface of the contact plug CPLG. The second filler pattern 410p may fill at least a portion of an internal space of the second outer void Va2. The inner void Vb, which is enclosed by the second filler pattern 410p, may be positioned in the second outer void Va2.

In an embodiment, the entire space of the third outer void Va3 may be filled with the second filler pattern 410p. Alternatively, the third outer void Va3 may be an empty region, which is enclosed by the first filler pattern 400p and is not fully filled with the second filler pattern 410p.

A top surface of the second filler pattern 410c on the cell region CR may be positioned at a level lower than a top surface of the second filler pattern 410p on the peripheral region PR.

An etch stop pattern 420 may cover the second filler pattern 410. In an embodiment, the etch stop pattern 420 may be formed of or include SiBN.

The etch stop pattern 420 may include an etch stop pattern 420c, which is positioned on the cell region CR and does not cover at least a portion of each of the landing pads LP. When viewed in a plan view, the etch stop pattern 420c may define empty regions, each of which exposes a top surface of each of the landing pads LP. In an embodiment, the empty region may have a circular shape.

The etch stop pattern 420 may include an etch stop pattern 420p that is provided on the peripheral region PR to cover the second filler pattern 410p. In an embodiment, the etch stop pattern 420p may fill at least a portion of the inner void Vb. Alternatively, the etch stop pattern 420p may be arranged to cover the inner void Vb. For example, the etch stop pattern 420p may be arranged to have a bottom surface, which is exposed by the inner void Vb, or by which the inner void Vb is closed. However, embodiments of the present inventive concept are not necessarily limited thereto.

A top surface of the etch stop pattern 420c on the cell region CR may be located at a level lower than a level of a top surface of the etch stop pattern 420p on the peripheral region PR.

On the cell region CR, bottom electrodes BE may be disposed on the landing pads LP, respectively. The bottom electrodes BE may be disposed on the empty regions of the etch stop pattern 420c. In an embodiment, the bottom electrodes BE may be formed of or include at least one material selected from doped polysilicon, metal nitride materials (e.g., titanium nitride), or metallic materials (e.g., tungsten, aluminum, and copper). In an embodiment, each of the bottom electrodes BE may have a circular pillar shape, a hollow cylinder shape, or a cup shape. An upper supporting pattern SS1 may be arranged to support upper portions of lateral side surfaces of the bottom electrodes BE, and a lower supporting pattern SS2 may be provided to support lower portions of lateral side surfaces of the bottom electrodes BE. In an embodiment, the upper and lower supporting patterns SS1 and SS2 may be formed of or include at least one of insulating materials (e.g., silicon nitride, silicon oxide, and silicon oxynitride).

A dielectric layer DL may be arranged to cover surfaces of the bottom electrodes BE and surfaces of the upper and lower supporting patterns SS1 and SS2. In an embodiment, the dielectric layer DL may be formed of or include at least one compound selected from silicon oxide, silicon nitride, silicon oxynitride, and high-k dielectric materials (e.g., hafnium oxide).

A top electrode TE may be disposed on the dielectric layer DL to fill a space between the bottom electrodes BE. In an embodiment, the top electrode TE may be formed of or include at least one compound selected from doped polycrystalline silicon, doped silicon germanium, metal nitrides (e.g., titanium nitride), and metallic materials (e.g., tungsten, aluminum, and copper).

The bottom electrodes BE, the dielectric layer DL, and the top electrode TE may constitute a capacitor CA.

In the peripheral region PR, an upper insulating pattern 500 may be disposed on the second filler pattern 410p. In an embodiment, the upper insulating pattern 500 may have substantially the same profile as the second filler pattern 410p. In this embodiment, the upper insulating pattern 500 may fill a portion of the inner void Vb. In an embodiment, the upper insulating pattern 500 may be formed of or include, for example, silicon oxide.

FIGS. 4A to 4E are enlarged plan views corresponding to a portion 'P2' of FIG. 2. Some example structures of the inner void Vb will be described in more detail with reference to FIGS. 4A to 4E.

Referring to embodiments of FIGS. 4A to 4E, the second outer void Va2, which is enclosed by the first filler pattern 400p, may be disposed between the contact plugs CPLG. The contact plugs CPLG may be enclosed by a wrapping pattern 390p, which is one of the wrapping pattern 390. At least a portion of the second outer void Va2 may be filled with the second filler pattern 410p, and the inner void Vb, which is enclosed by the second filler pattern 410p, may be disposed in the second outer void Va2.

Figure 4A:
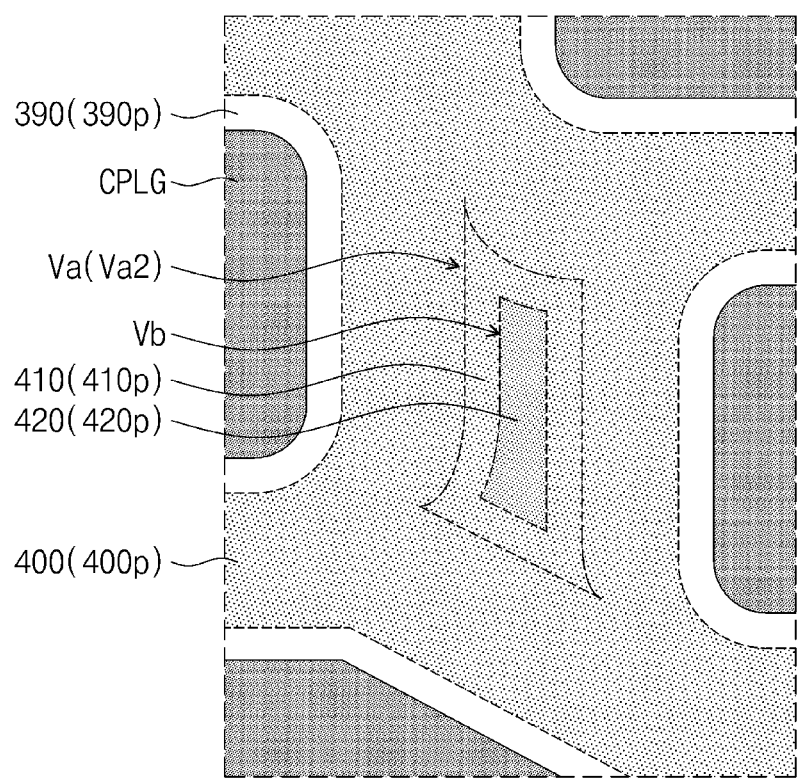
FIGS. 4A to 4E are enlarged plan views of a semiconductor device corresponding to a portion 'P2' of FIG. 2 according to embodiments of the present inventive concept.
Figure 4B:
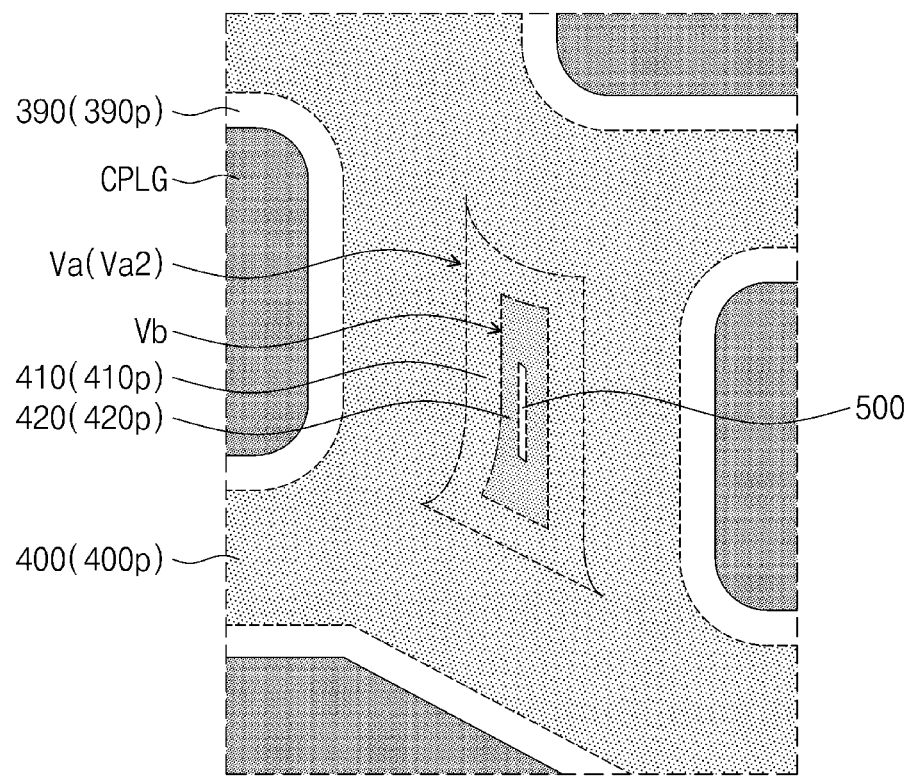
Figure 4C:
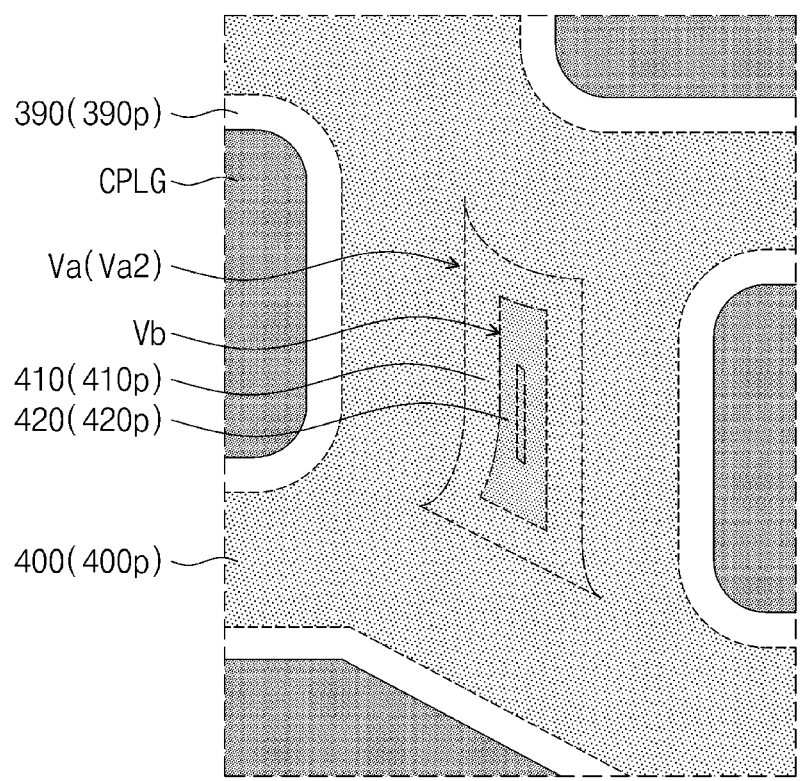

Referring to embodiments of FIGS. 4A to 4C, at least a portion of the inner void Vb may be filled with the etch stop pattern 420p. For example, the entire inner space of the inner void Vb may be filed with the etch stop pattern 420p, as shown in an embodiment of FIG. 4A. As another example, the etch stop pattern 420p may be arranged to cover an inner side surface of the inner void Vb and to enclose a portion of the upper insulating pattern 500, which is extended into the inner void Vb, as shown in an embodiment of FIG. 4B. In another example, the etch stop pattern 420p may be disposed to cover an inner side surface of the inner void Vb, and an empty region, which is enclosed by the etch stop pattern 420p, may be formed in the inner void Vb, as shown in an embodiment of FIG. 4C.

Figure 4D:
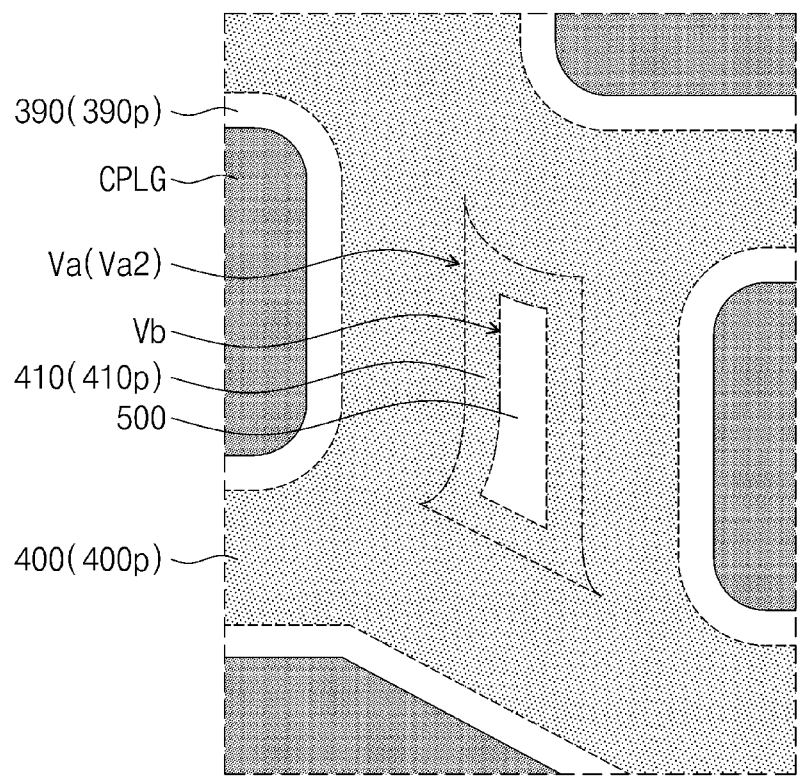
Figure 4E:
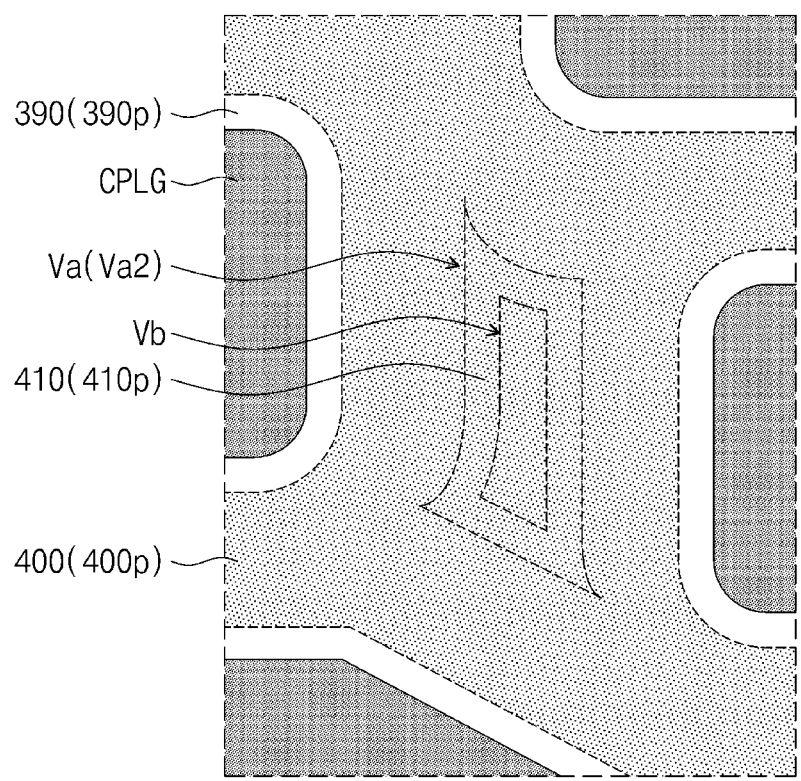

Referring to embodiments of FIGS. 4D and 4E, the etch stop pattern 420p may not be disposed in the inner void Vb. For example, the upper insulating pattern 500 may be arranged to fill the entire region of the inner void Vb, as shown in an embodiment of FIG. 4D. As another example, the inner void Vb may be an empty region, which is enclosed by the second filler pattern 410p, as shown in an embodiment of FIG. 4E.

Figure 5:
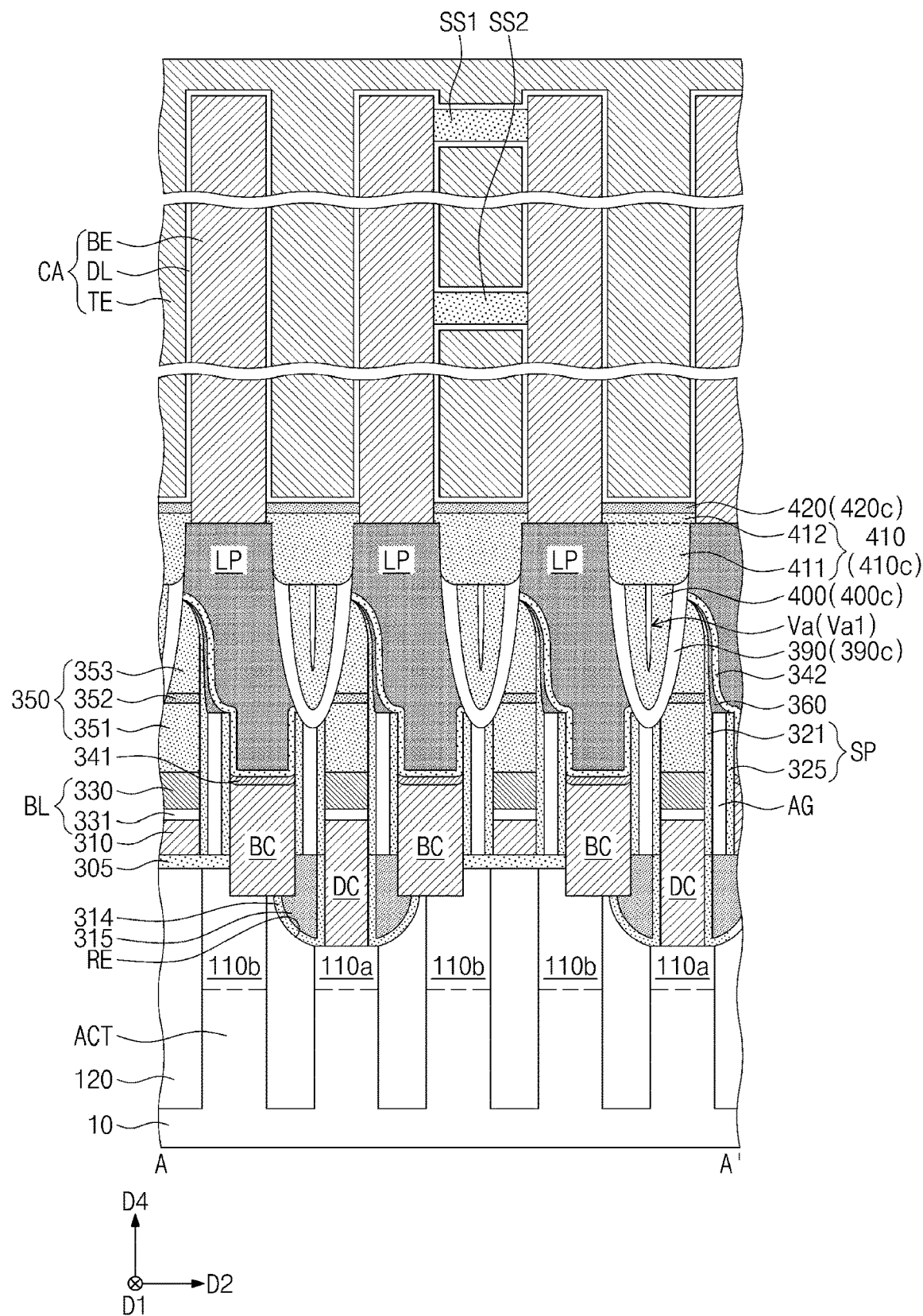
Figure 6:
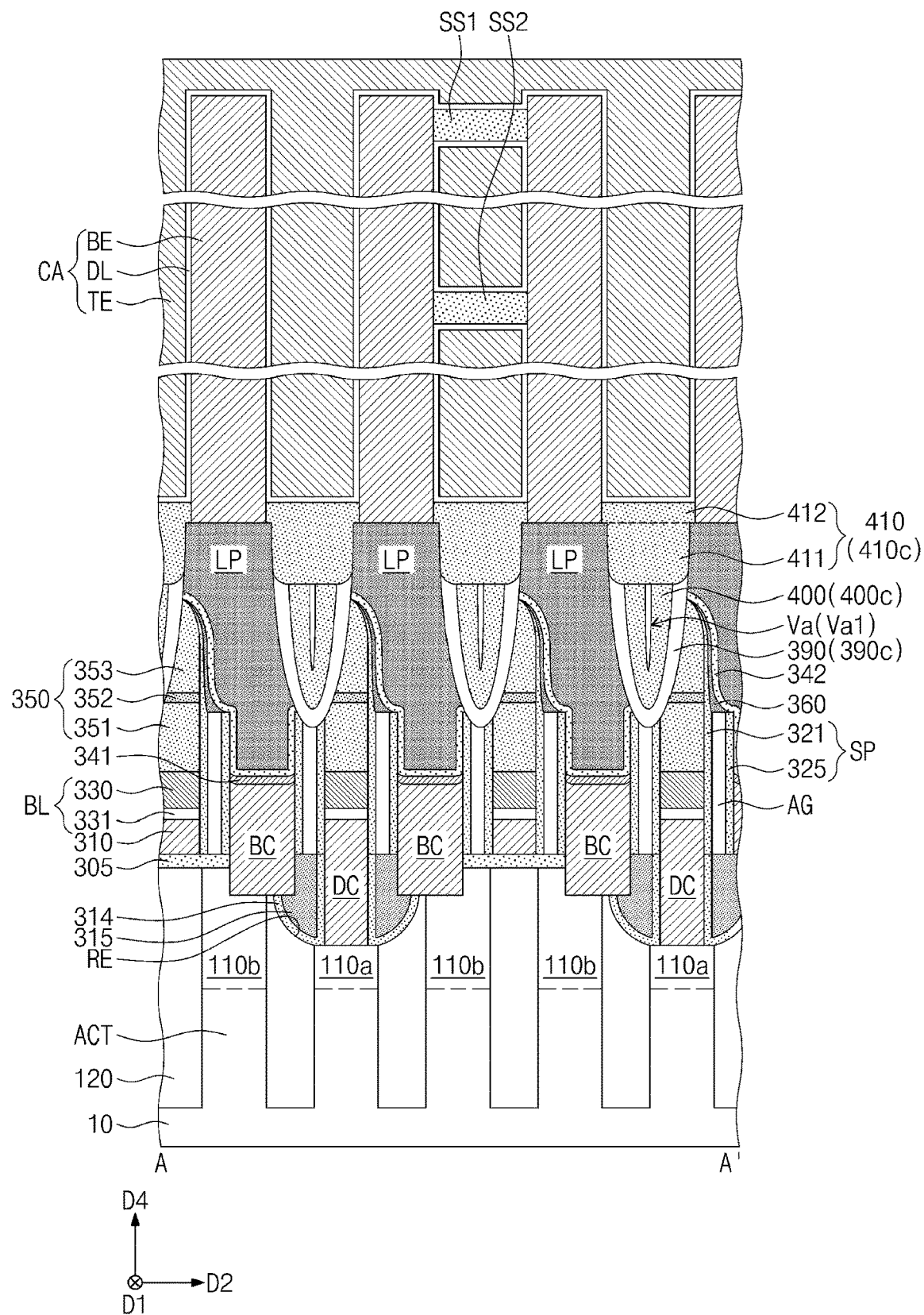
Figure 7:
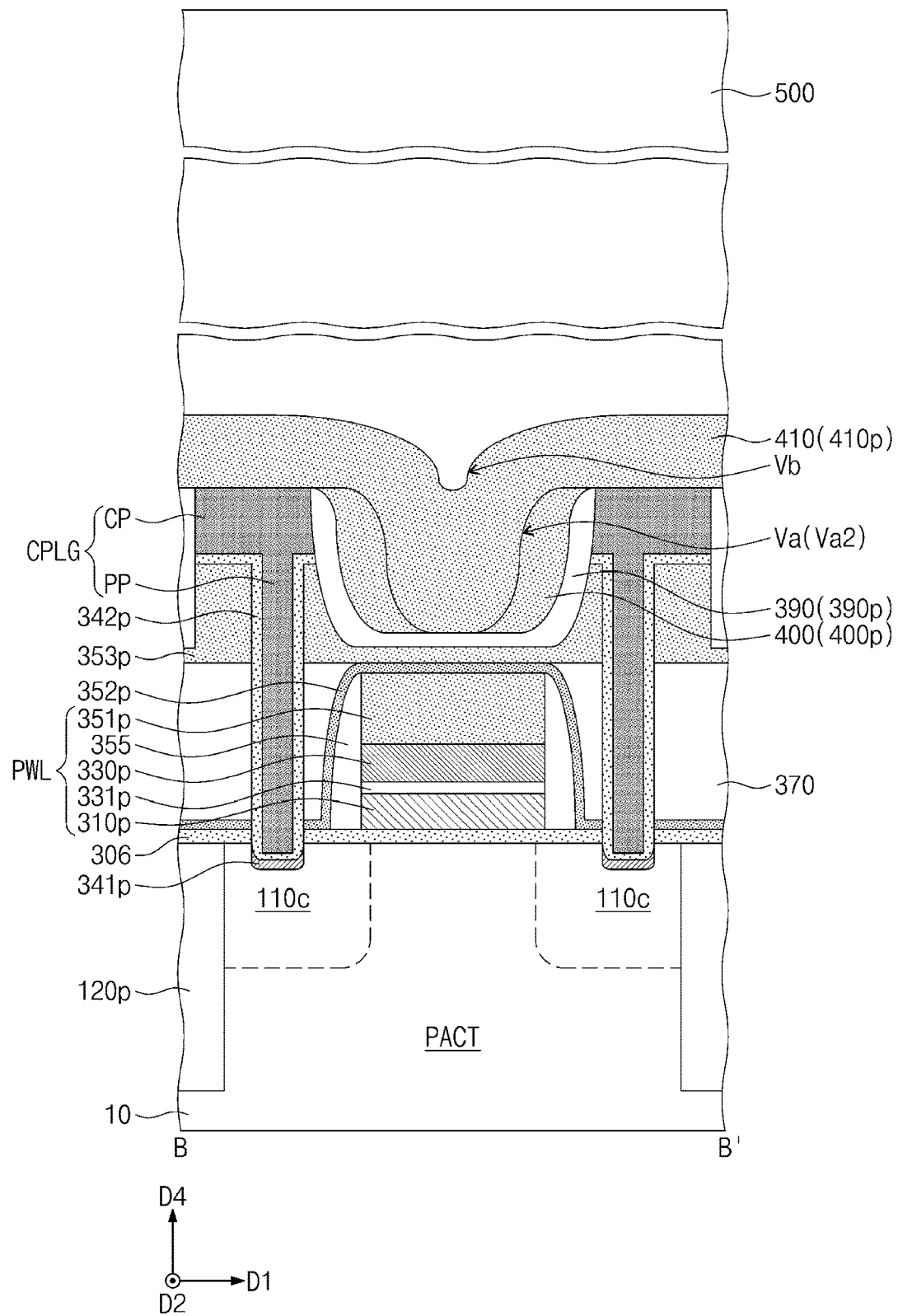

FIGS. 5 and 6 are cross-sectional views taken along the line A-A' of FIG. 2. FIG. 7 is a cross-sectional view taken along the line B-B' of FIG. 2. Hereinafter, some example structures for the second filler pattern 410 and the etch stop pattern 420 will be described in more detail with reference to embodiments of FIGS. 5 to 7.

Referring to embodiments of FIGS. 5 and 6, the second filler pattern 410c on the cell region CR may include body portions 411, which are located at a level lower than or equal to a level of the top surfaces of the landing pads LP, and a protruding portion 412, which is located at a level higher than a level of the top surfaces of the landing pads LP. The body portions 411 may be interposed between the landing pads LP. The protruding portion 412 may be disposed on the body portions 411 but may not be disposed on at least a portion of the top surface of the landing pad LP.

The dielectric layer DL may be disposed on a top surface of the protruding portion 412. Referring to an embodiment of FIG. 5, the etch stop pattern 420c may be further disposed on the top surface of the protruding portion 412, and in this embodiment, the dielectric layer DL may be arranged to cover a top surface of the etch stop pattern 420c. As another example, referring to an embodiment of FIG. 6, the dielectric layer DL may be arranged to be in direct contact with the top surface of the protruding portion 412.

Referring to an embodiment of FIG. 7, on the peripheral region PR, the upper insulating pattern 500 may cover the second filler pattern 410p. The upper insulating pattern 500 may be in direct contact with the second filler pattern 410p. The etch stop pattern 420p may not be interposed between the second filler pattern 410p and the upper insulating pattern 500.

FIGS. 8, 10, 12, and 14 are plan views illustrating a method of fabricating a semiconductor device according to embodiments of the present inventive concept and corresponding to a portion 'P1' of FIG. 1. FIGS. 9A, 11A, 13A, and 15A are cross-sectional views taken along lines A-A' of FIGS. 8, 10, 12, and 14, respectively. FIGS. 9B, 11B, 13B, and 15B are cross-sectional views taken along lines B-B' of FIGS. 8, 10, 12, and 14, respectively. The method of fabricating a semiconductor device according to an embodiment of the present inventive concept will be described in more detail below. For concise description, a previously described element may be identified by the same reference number without repeating an overlapping description thereof.

Figure 8:
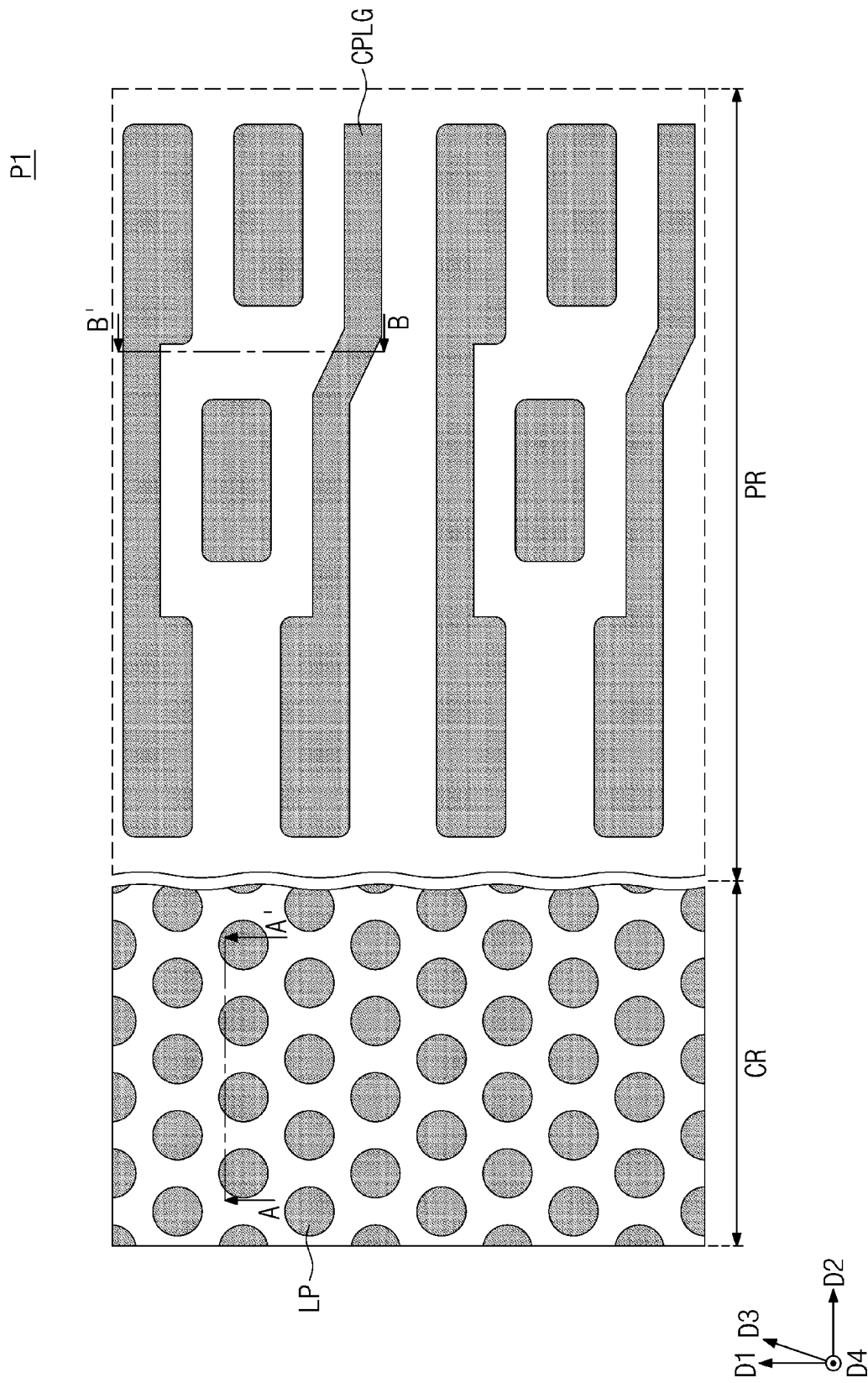
FIGS. 8, 10, 12, and 14 are plan views illustrating a method of fabricating a semiconductor device according to embodiments of the present inventive concept and corresponding to a portion 'P1' of FIG. 1.
Figure 9A:
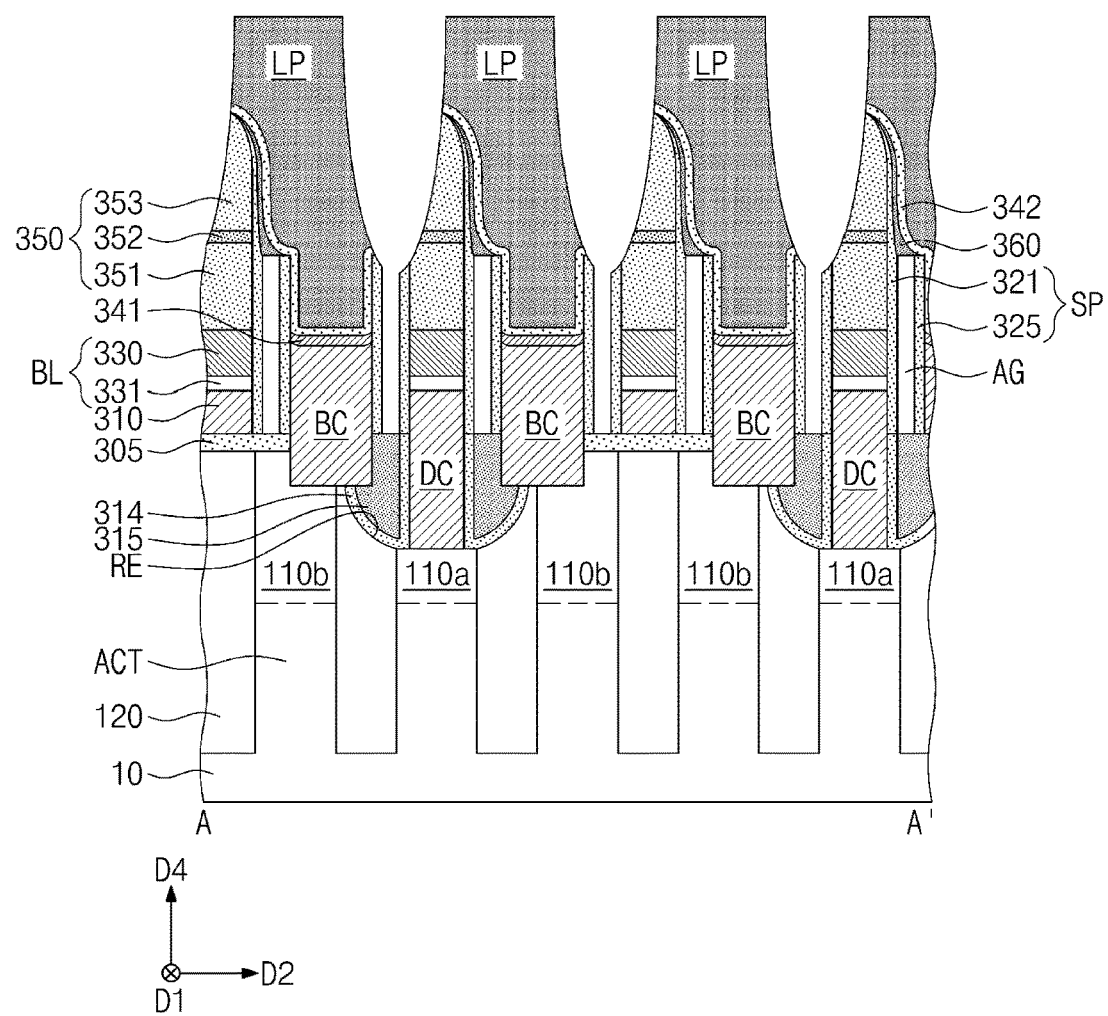
FIGS. 9A, 11A, 13A, and 15A are cross-sectional views of a method of fabricating a semiconductor device taken along lines A-A' of FIGS. 8, 10, 12, and 14, respectively according to embodiments of the present inventive concept.
Figure 9B:
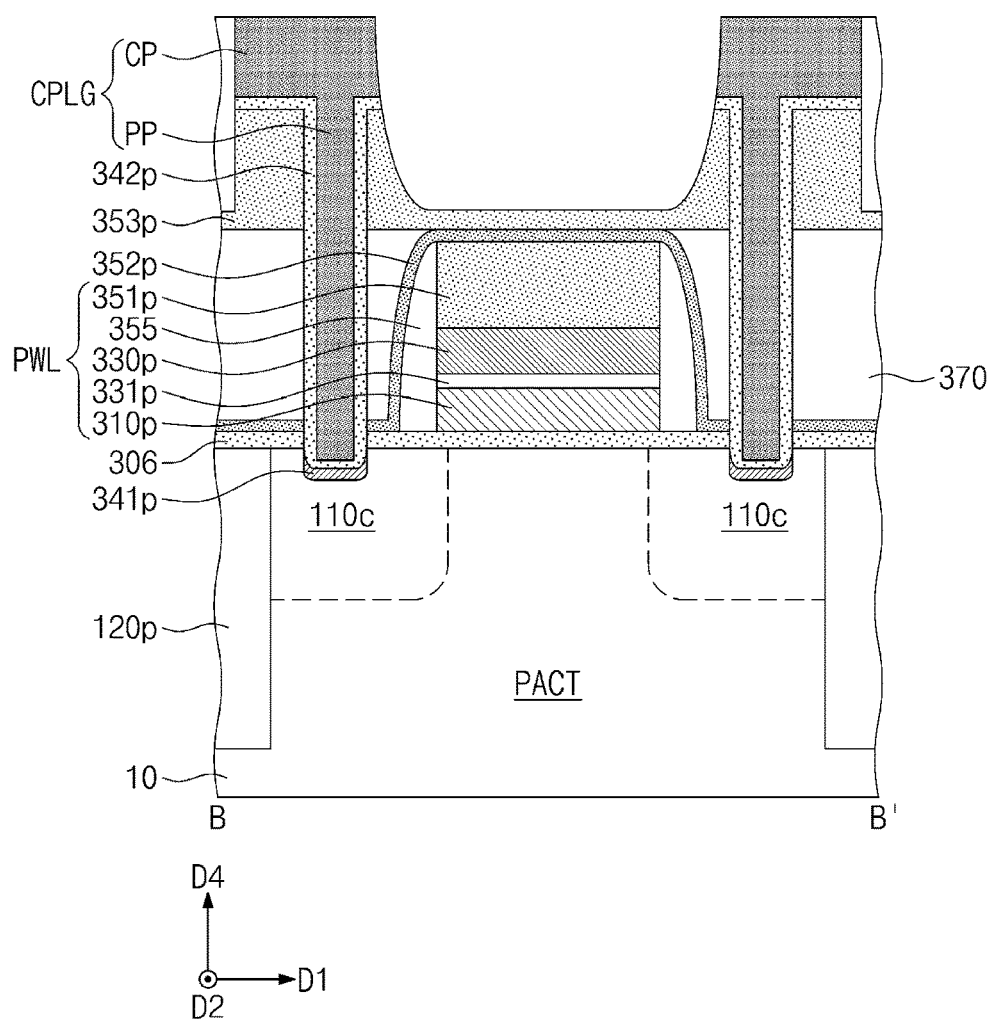
FIGS. 9B, 11B, 13B, and 15B are cross-sectional views of a method of fabricating a semiconductor device taken along lines B-B' of FIGS. 8, 10, 12, and 14, respectively.

Referring to embodiments of FIGS. 8, 9A, and 9B, the substrate 10 includes the cell region CR and the peripheral region PR.

On the cell region CR, the cell active patterns ACT and the device isolation layers 120 may be formed in the substrate 10. The cell active patterns ACT may be spaced apart from each other in the first and second directions D1 and D2, which are parallel to the top surface of the substrate 10 and are non-parallel (e.g., orthogonal or crossing) to each other. The cell active patterns ACT may be bar-shaped patterns extended in the third direction D3, which is parallel to the top surface of the substrate 10 and is not parallel to the first and second directions D1 and D2. The device isolation layers 120 may be disposed in the substrate 10 to define the cell active patterns ACT.

In an embodiment, word lines may be formed on the cell region CR to cross the cell active patterns ACT and the device isolation layers 120. The word lines may extend in the second direction D2 and may be spaced apart from each other in the first direction D1. The word lines may be buried in the substrate 10.

Impurity regions may be formed in the cell active patterns ACT and may include the first impurity regions 110a and the second impurity regions 110b. The second impurity regions 110b may be formed in opposite edge regions of each of the cell active patterns ACT, and each of the first impurity regions 110a may be formed between the second impurity regions 110b, which are formed in each of the cell active patterns ACT.

The buffer pattern 305, the bit line contacts DC, the polysilicon patterns 310, the bit lines BL, and the capping patterns 350 may be formed on the cell region CR.

In an embodiment, a buffer layer and a poly-silicon layer may be stacked on the substrate 10, and the recess region RE may be formed in upper portions of the first impurity regions 110a and upper portions of the device isolation layers 120 adjacent thereto. In an embodiment, the recess region RE may be formed by etching the buffer layer, the poly-silicon layer, upper portions of the first impurity regions 110a, and upper portions of the device isolation layers 120 adjacent thereto. In an embodiment, a portion of the buffer layer which is left after the etching process may form the buffer pattern 305. Thereafter, preliminary bit line contacts may be formed to fill the recess region RE, and a bit line layer and a capping layer may be sequentially formed. The bit line contacts DC, the polysilicon patterns 310, the bit lines BL, and the capping patterns 350 may be formed by etching the preliminary bit line contacts, the poly-silicon layer, the bit line layer, and the capping layer, respectively. In an embodiment, the bit line layer may include an ohmic layer and a metal-containing layer. The capping layer may include a first capping layer, a second capping layer, and a third capping layer.

The bit lines BL may be formed to extend in the first direction D1 and to be positioned adjacent to each other in the second direction D2. Each of the bit lines BL may include the first ohmic pattern 331 and the metal-containing pattern 330, which are sequentially stacked (e.g., in the fourth direction D4).

The capping patterns 350 may be formed to extend in the first direction D1 and to be positioned adjacent to each other in the second direction D2. Each of the capping patterns 350 may include the first capping pattern 351, the second capping pattern 352, and the third capping pattern 353, which are sequentially stacked (e.g., in the fourth direction D4).

The bit line spacers SP may be formed to cover lateral side surfaces of the bit lines BL and the capping patterns 350. In an embodiment, during this process, the first gapfill insulating pattern 314 and the second gapfill insulating pattern 315 may be formed to fill a portion of the recess region RE that is not filled by the bit line contacts DC. Each of the bit line spacers SP may include the first and second sub-spacers 321 and 325, which are spaced apart from each other. As an example, as shown in an embodiment of FIG. 9A, the first and second sub-spacers 321 and 325 may be formed to be spaced apart from each other by the air gap AG.

The storage node contacts BC may be formed to be interposed between the bit lines BL (e.g., in the second direction D2). The storage node contacts BC may be formed between an adjacent pair of the bit lines BL. The storage node contacts BC may be spaced apart from each other in the first and second directions D1 and D2. Each of the storage node contacts BC may be electrically connected to a corresponding one of the second impurity regions 110b.

The second ohmic pattern 341 may be formed on each of the storage node contacts BC. The diffusion prevention pattern 342 may be formed to conformally cover the second ohmic pattern 341, the bit line spacer SP, and the capping pattern 350.

The landing pads LP may be formed on the diffusion prevention pattern 342. As a result of the formation of the landing pads LP, the diffusion prevention pattern 342 may be interposed between the landing pads LP and the capping pattern 350, between the landing pads LP and the bit line spacer SP, and between the landing pads LP and the storage node contacts BC. Each of the landing pads LP may be electrically connected to a corresponding one of the storage node contacts BC.

In an embodiment, the formation of the landing pads LP may include forming a contact layer on the diffusion prevention pattern 342 and performing an etching process to divide the contact layer into the landing pads LP, which are respectively disposed on the storage node contacts BC. As a result of the etching of the contact layer, an empty region may be formed between the landing pads LP. The empty region may be formed to expose the air gap AG.

On the peripheral region PR, the peripheral active patterns PACT and the peripheral device isolation layers 120p may be formed in the substrate 10. The peripheral impurity regions 110c may be formed in the peripheral active patterns PACT. The peripheral gate dielectric pattern 306 may be formed on the peripheral active patterns PACT and the peripheral device isolation layers 120p.

The peripheral word line PWL may be formed on the peripheral active patterns PACT. The peripheral word line PWL may include the peripheral polysilicon pattern 310p, the first peripheral ohmic pattern 331p, the peripheral metal-containing pattern 330p, and the first peripheral capping pattern 351p, which are sequentially stacked (e.g., in the fourth direction D4). The peripheral word line PWL may further include the peripheral spacer 355. The peripheral polysilicon pattern 310p, the first peripheral ohmic pattern 331p, the peripheral metal-containing pattern 330p, and the first peripheral capping pattern 351p may be formed by etching the poly-silicon layer, the ohmic layer, the metal-containing layer, and the first capping layer, respectively.

The second peripheral capping pattern 352p may be formed to cover the peripheral word line PWL and to extend along the lateral side surface of the peripheral spacer 355 and the top surface of the peripheral gate dielectric pattern 306. The second peripheral capping pattern 352p may be formed by etching the second capping layer.

The lower insulating pattern 370 may be formed to enclose the second peripheral capping pattern 352p. The lower insulating pattern 370 may be formed of or include silicon oxide.

The third peripheral capping pattern 353p may be formed on the lower insulating pattern 370 and the peripheral word line PWL. The third peripheral capping pattern 353p may be formed on the peripheral word line PWL to cover the second peripheral capping pattern 352p. In an embodiment, the third peripheral capping pattern 353p may be formed by etching the third capping layer.

The contact plugs CPLG including the contact pad CP and the penetration plug PP may be formed. In an embodiment, the formation of the contact plugs CPLG may include performing an etching process to form holes penetrating the third peripheral capping pattern 353p, the lower insulating pattern 370, the peripheral gate dielectric pattern 306, and an upper portion of the substrate 10, forming a contact layer to fill the hole and to cover the third peripheral capping pattern 353p, and performing an etching process to divide the contact layer into the contact plugs CPLG. In an embodiment, the contact layer forming the contact plugs CPLG on the peripheral region PR may be the same as the contact layer that forms the landing pads LP on the cell region CR. During this process, the second peripheral ohmic pattern 341p may be formed between the penetration plug PP and the substrate 10 (e.g., in the fourth direction D4), and the peripheral diffusion prevention pattern 342p may be formed to enclose the penetration plug PP and to be interposed between a bottom surface of the contact pad CP and the third peripheral capping pattern 353p. As a result of the etching of the contact layer, an empty region may be disposed below the contact plugs CPLG. A bottom surface of the empty region may be formed in the third peripheral capping pattern 353p.

In an embodiment, the landing pads LP on the cell region CR and the contact plugs CPLG on the peripheral region PR may be separated from each other by the same etching process performed in common on the contact layer.

Figure 10:
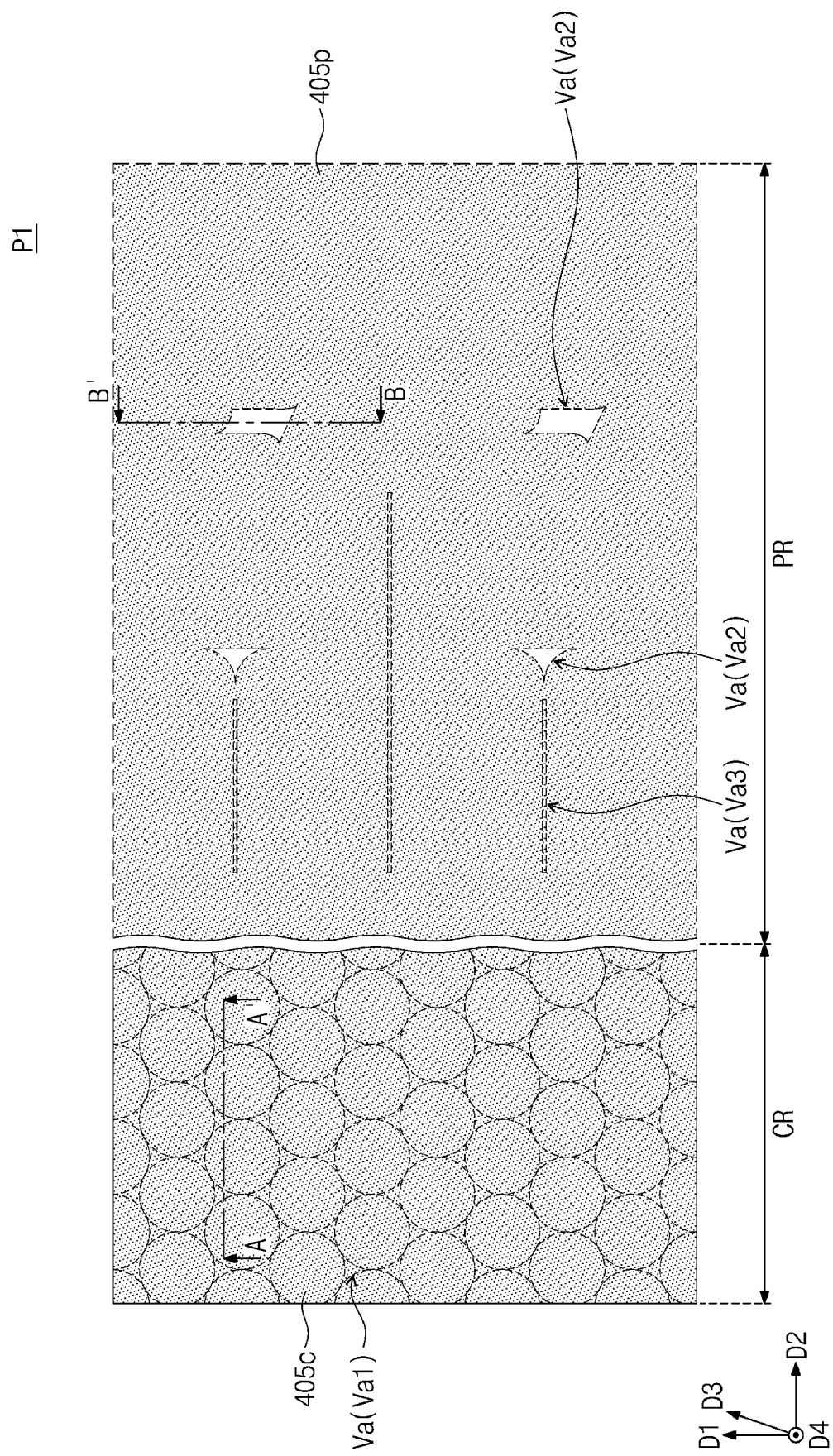
Figure 11A:
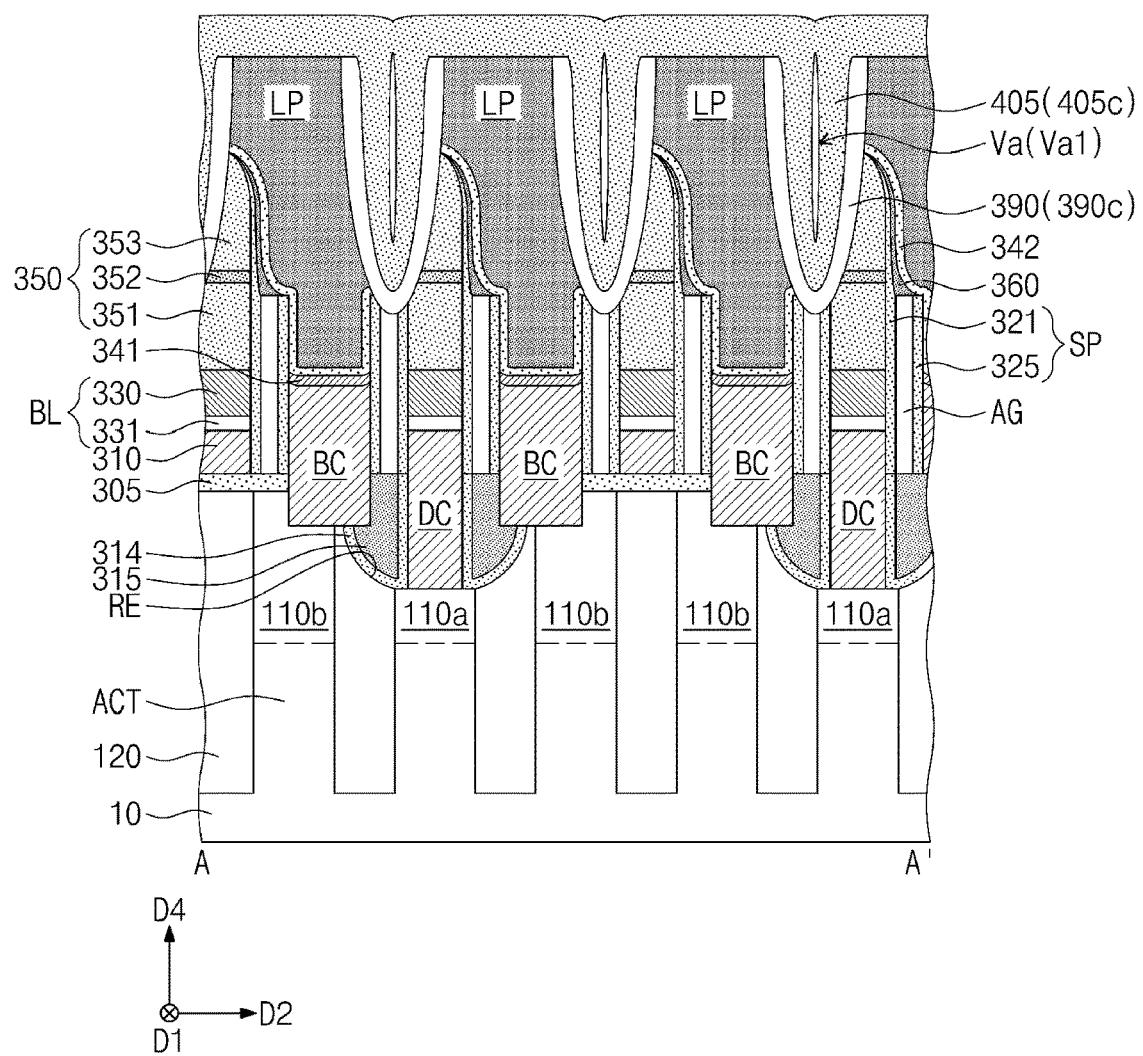
Figure 11B:
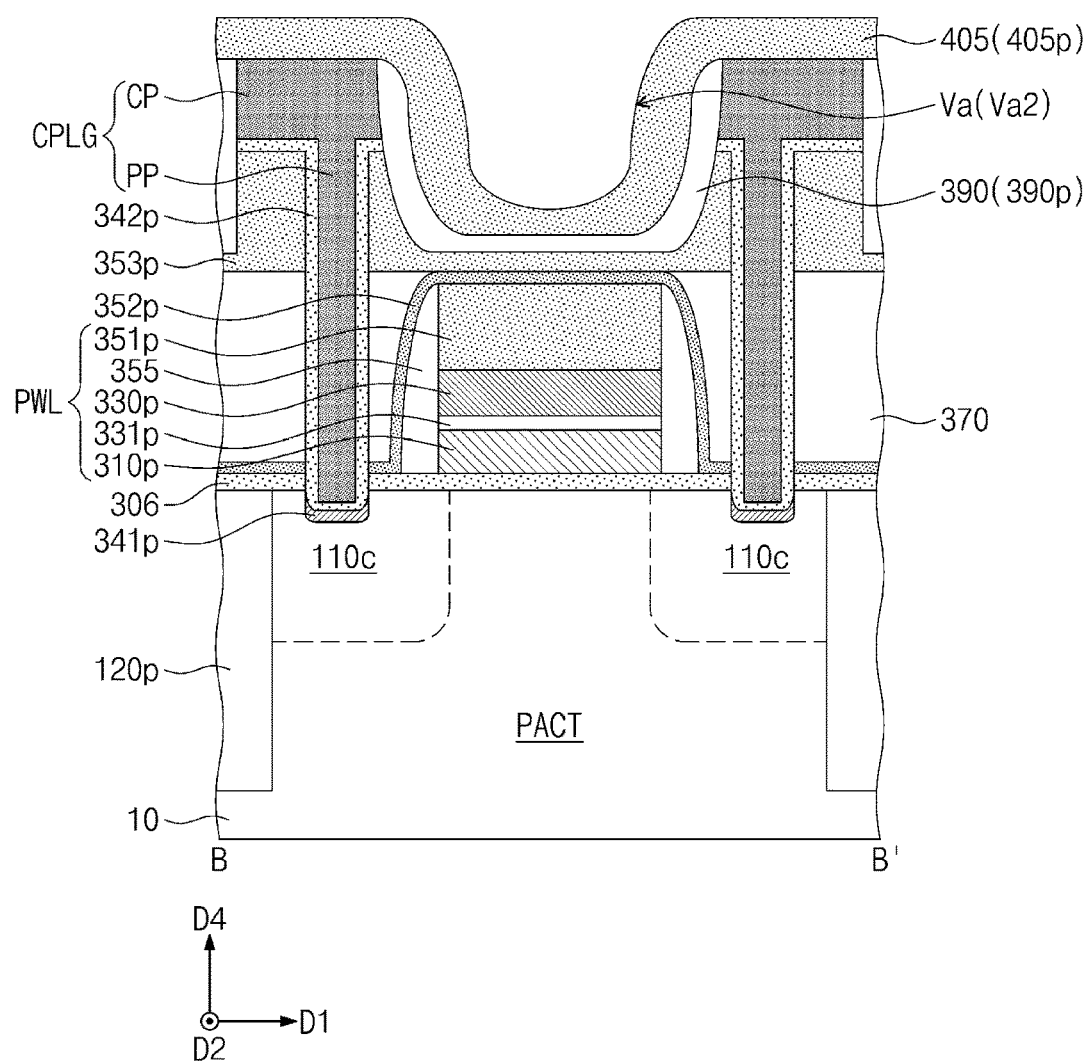

Referring to embodiments of FIGS. 10, 11A, and 11B, the wrapping pattern 390 may be formed to wrap the landing pads LP and the contact plugs CPLG. The wrapping pattern 390 may wrap a portion of a lateral side surface of the landing pad LP and a portion of a lateral side surface of the capping pattern 350 on the cell region CR and may wrap a portion of a lateral side surface of the contact plug CPLG and a portion of a lateral side surface of the third peripheral capping pattern 353p on the peripheral region PR.

A first filler layer 405 may be formed to fill spaces between the landing pads LP and between the contact plugs CPLG. During the formation of the first filler layer 405, the outer voids Va may be formed in the first filler layer 405. The structure of the outer voids Va may vary depending on a distance between the landing pads LP and a distance between the contact plugs CPLG. As an example, in an embodiment, the outer void Va may be an empty region, which is positioned between the landing pads LP or between the contact plugs CPLG spaced apart from each other by a relatively small distance and is enclosed by the first filler layer 405. As another example, in an embodiment, the outer void Va may be a region, which is positioned between the landing pads LP or between the contact plugs CPLG spaced apart from each other by a relatively large distance, is enclosed by the first filler layer 405, but has an upper portion exposed to the outside.

Referring to an embodiment of FIG. 11A, a first filler layer 405c, which is a portion of the first filler layer 405 on the cell region CR, may be formed to partially fill a region between the landing pads LP and to define the first outer void Va1 therein. The first outer void Va1 may be an isolated empty region, which is enclosed by the first filler layer 405c. The first filler layer 405c may cover the wrapping pattern 390c and may extend to regions on the top surfaces of the landing pads LP.

Referring to an embodiment of FIG. 11B, a first filler layer 405p, which is a portion of the first filler layer 405 on the peripheral region PR, may be formed to partially fill a region between the contact plugs CPLG and to define the second outer void Va2 therein. The second outer void Va2 may be a region, which is enclosed by the first filler layer 405p and has a top portion exposed to the outside. The first filler layer 405p may cover the wrapping pattern 390p and may extend to regions on the top surfaces of the contact plugs CPLG.

Figure 12:
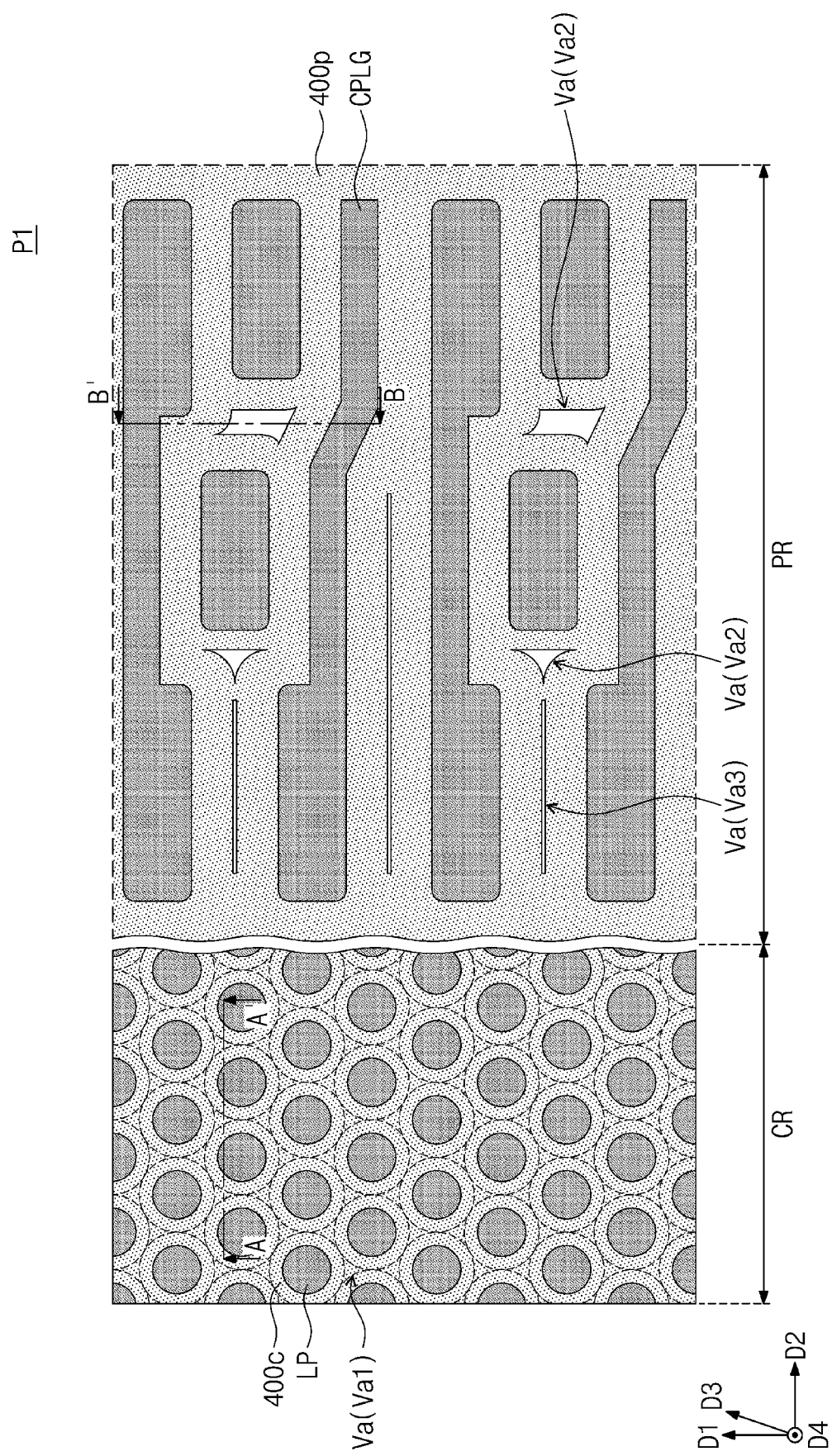
Figure 13A:
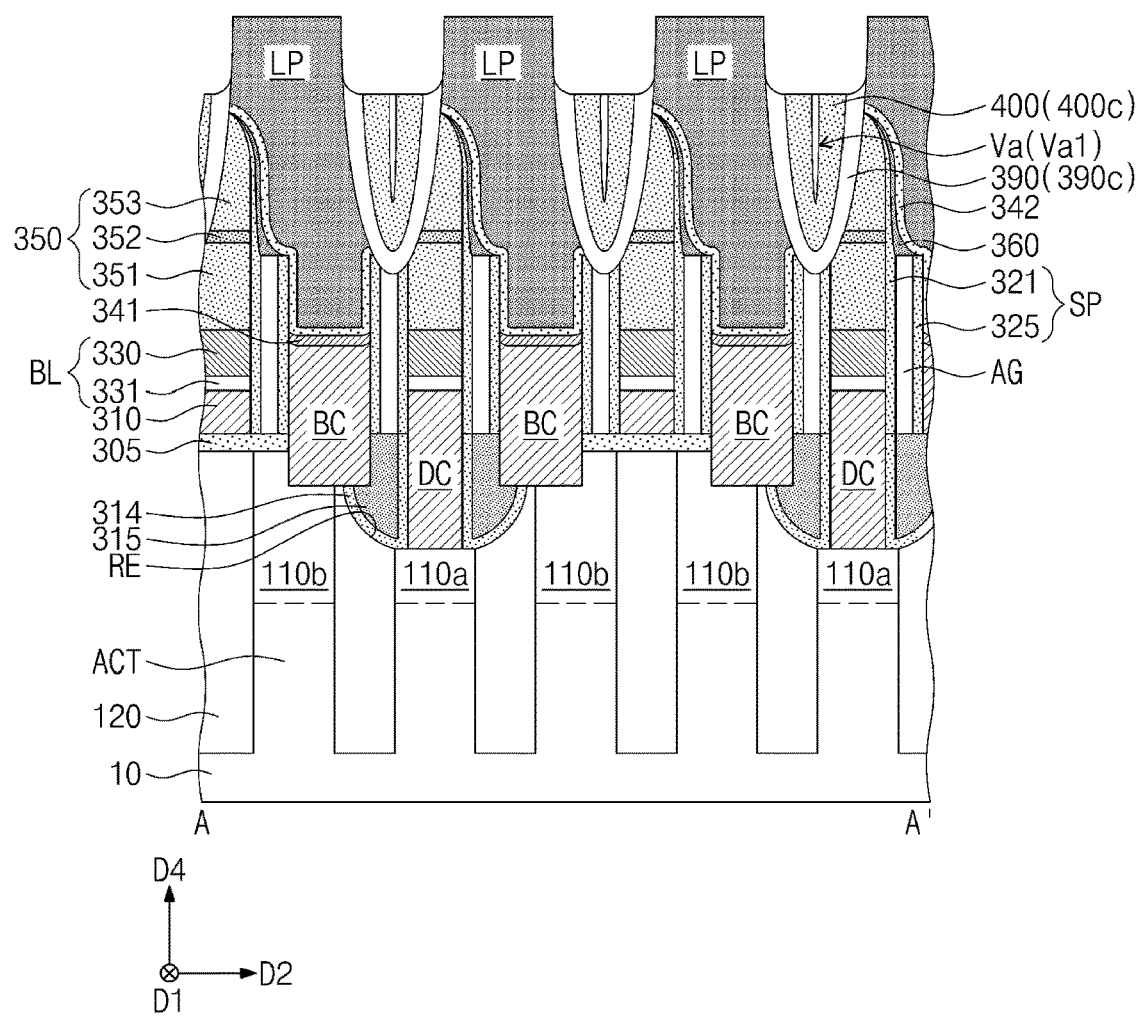
Figure 13B:
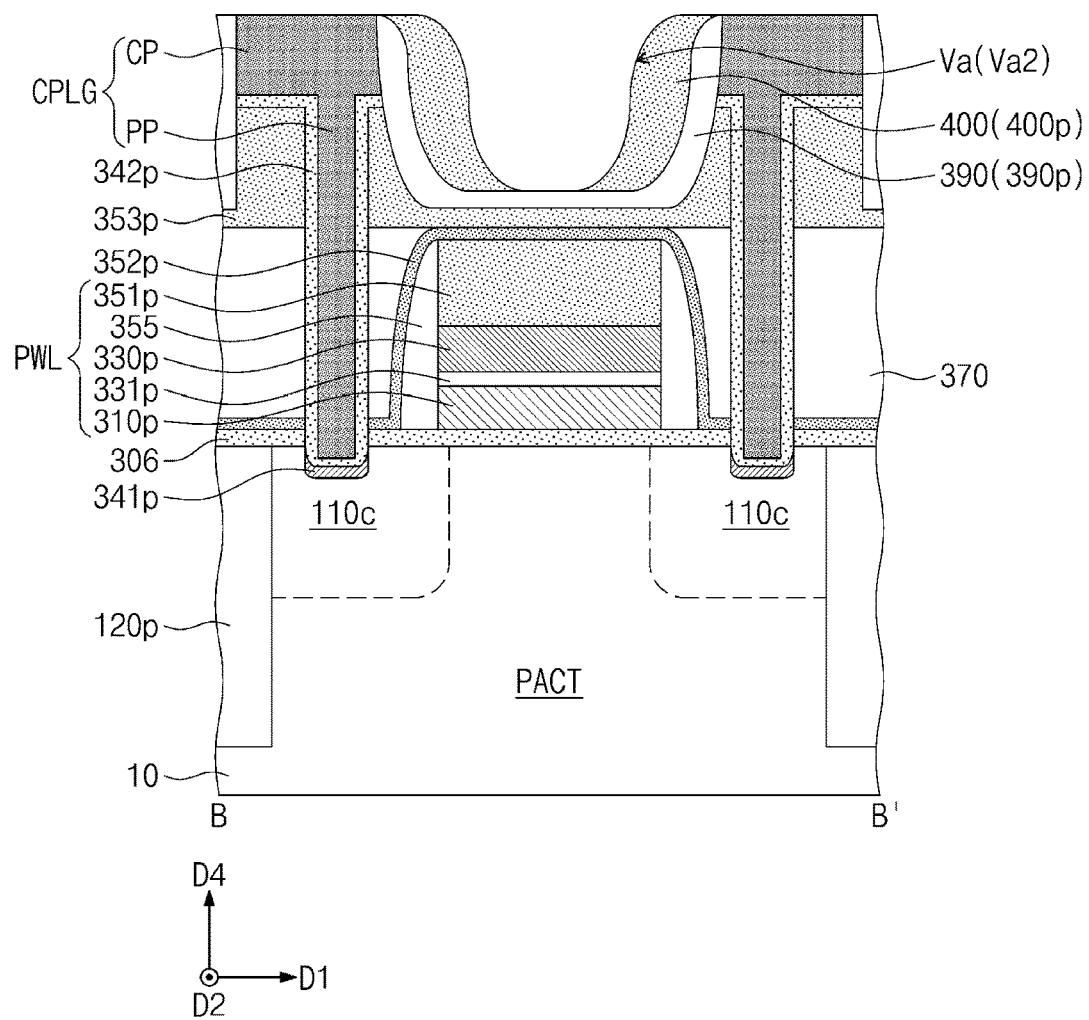

Referring to embodiments of FIGS. 12, 13A, and 13B, an etching process may be performed to form the first filler pattern 400 from the first filler layer 405p. The first filler pattern 400 may be a portion of the first filler layer 405p, which is left after the process of etching an upper portion of the first filler layer 405p is performed. In an embodiment, an upper portion of the wrapping pattern 390 may be further removed during the etching process.

As a result of the etching process, an upper portion of the first outer void Va1 on the cell region CR may be exposed to the outside. The first filler pattern 400c may have a top surface that is located at a level lower than the top surfaces of the landing pads LP and higher than the top surface of the capping pattern 350.

On the peripheral region PR, the first filler pattern 400p may be formed to cover the wrapping pattern 390p. The second outer void Va2 may be a region enclosed by the first filler pattern 400p.

Figure 14:
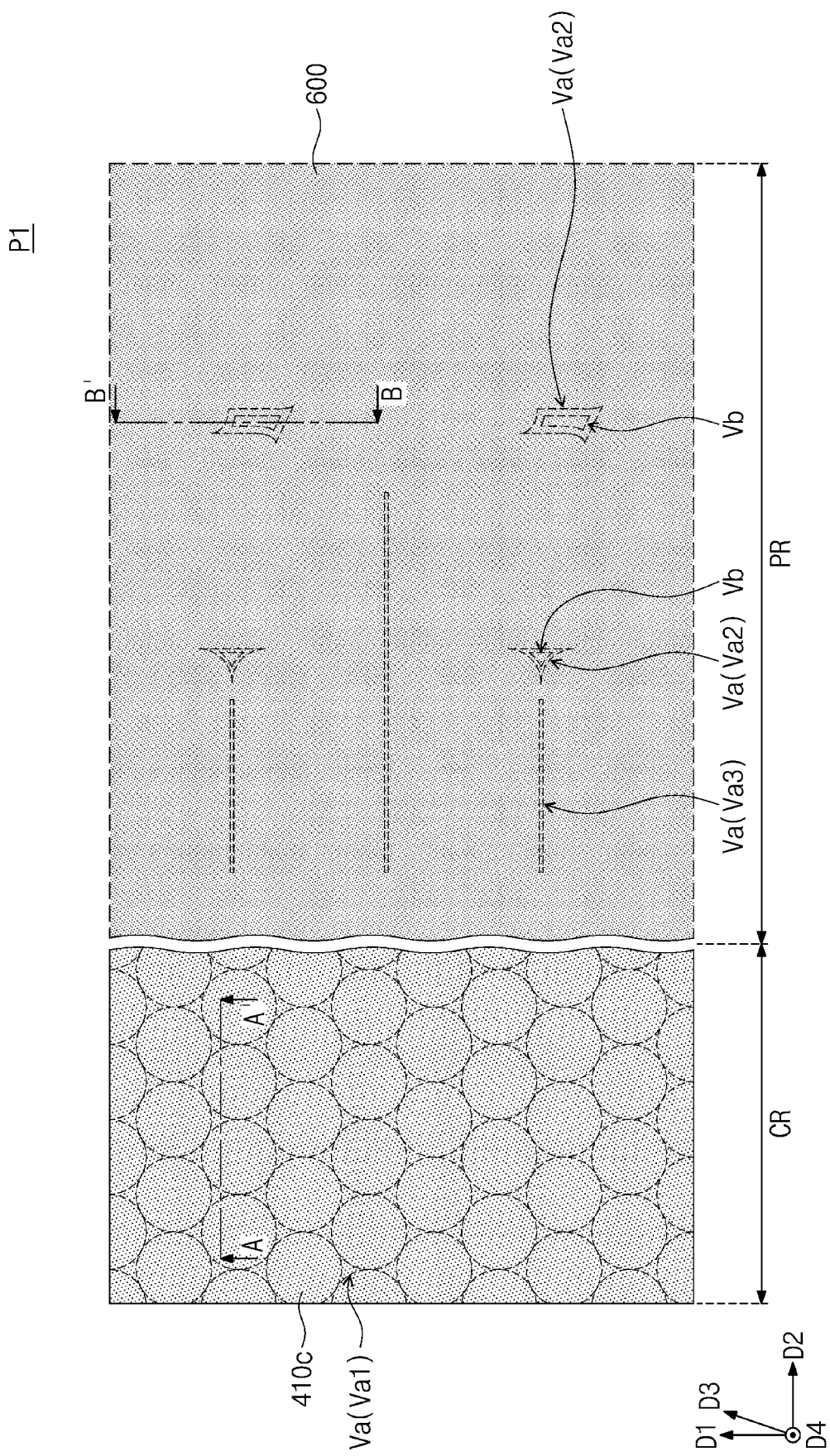
Figure 15A:
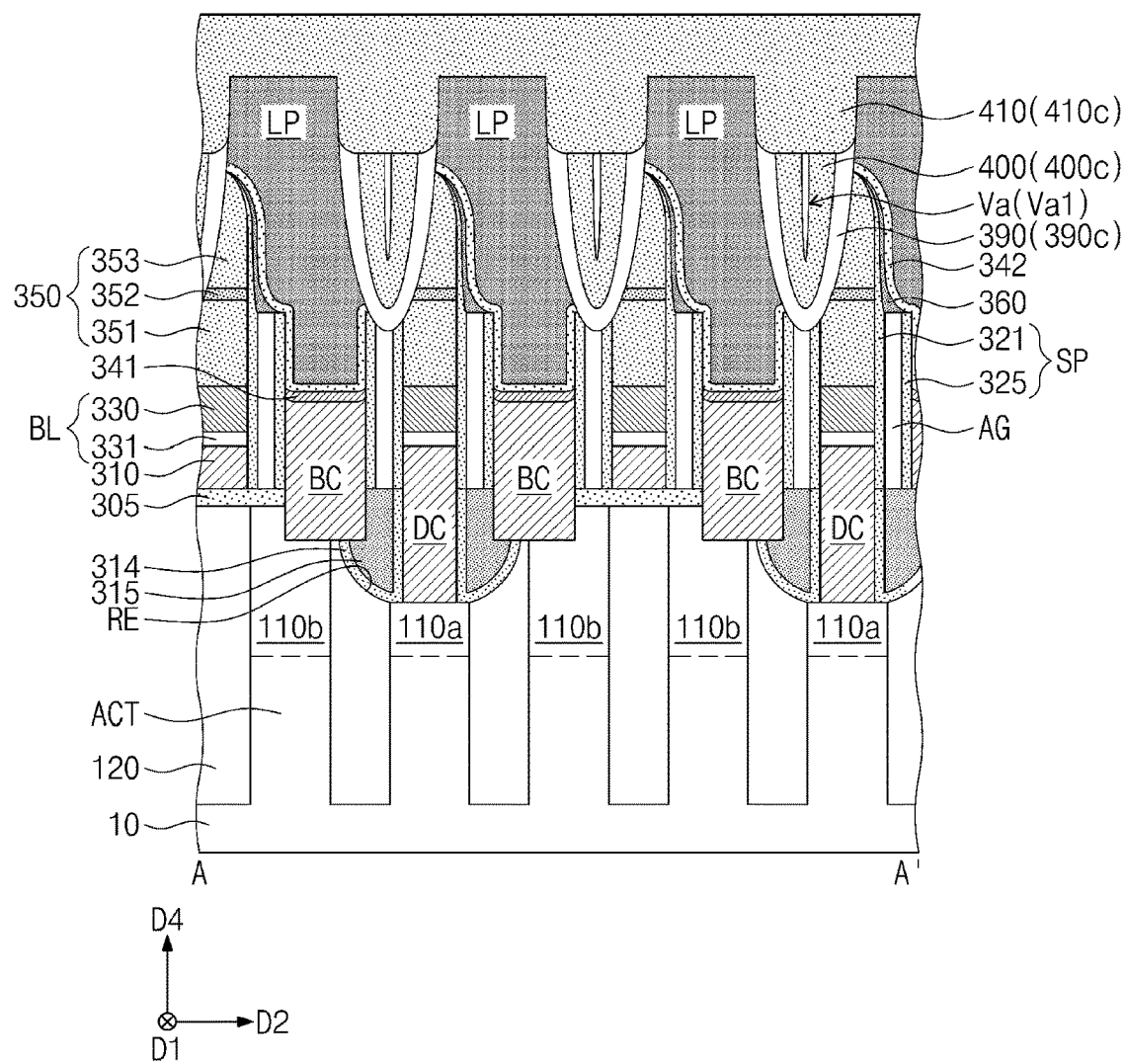
Figure 15B:
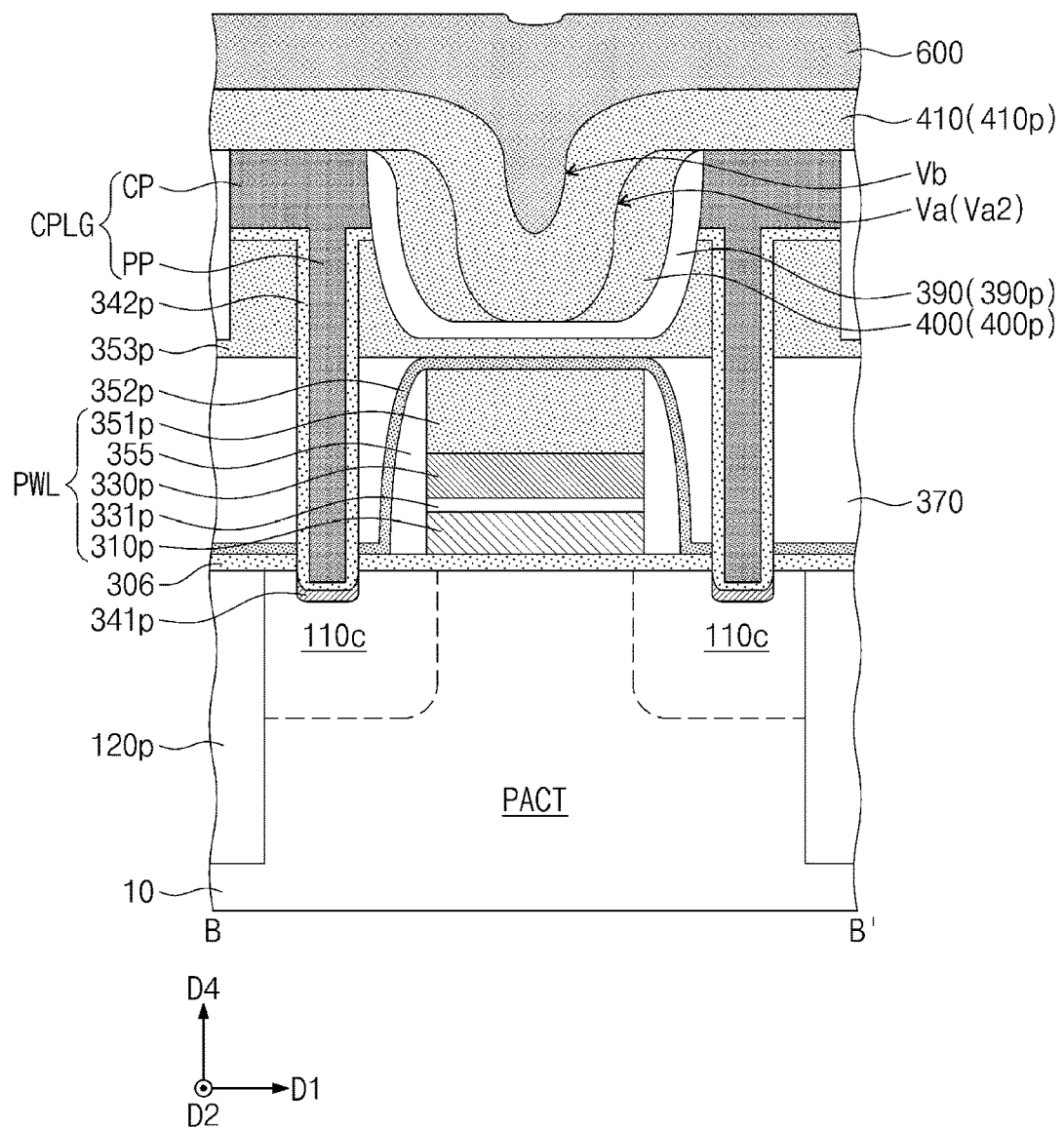

Referring to embodiments of FIGS. 14, 15A, and 15B, the second filler pattern 410 may be formed on the first filler pattern 400. The second filler pattern 410 may cover the first filler pattern 400, the first outer void Va1, the landing pads LP, and the contact plugs CPLG and may fill a portion of the second outer void Va2. As a result of the formation of the second filler pattern 410, the inner void Vb, which is enclosed by the second filler pattern 410, may be formed in the second outer void Va2. The first outer void Va1 may be an empty region, which is covered with the second filler pattern 410 and is enclosed by the first filler pattern 400. The second filler pattern 410 may be formed of or include the same material as the first filler pattern 400. In an embodiment, the first filler pattern 400 and the second filler pattern 410 may be formed of or include silicon nitride.

Thereafter, a mask pattern 600 may be formed on the peripheral region PR. The mask pattern 600 may not be formed on the cell region CR.

Referring back to embodiments of FIGS. 2, 3A, and 3B, an upper portion of the second filler pattern 410c on the cell region CR may be at least partially etched. The upper portion of the second filler pattern 410c may be a portion that is located at a level higher than the top surfaces of the landing pads LP. In an embodiment, during the etching process, the second filler pattern 410p on the peripheral region PR may not be etched.

An etch stop layer may be formed on the second filler pattern 410. The etch stop layer may be formed to cover the second filler pattern 410. In an embodiment, the etch stop pattern 420 may be formed by etching the etch stop layer. The etch stop pattern 420 may be formed of or include SiBN.

The etch stop pattern 420c on the cell region CR may be formed to have empty regions. Each of the empty regions may be formed to expose a top surface of a corresponding one of the landing pads LP. In an embodiment, the empty region may have a circular shape, when viewed in a plan view. The etch stop pattern 420c may be vertically overlapped with the second filler pattern 410c. For example, the etch stop pattern 420c on the cell region CR may be arranged to overlap the second filler pattern 410c in a vertical direction (e.g., the fourth direction D4).

The etch stop pattern 420p on the peripheral region PR may be formed to cover the second filler pattern 410p. In an embodiment, the etch stop pattern 420p may be formed to fill at least a portion of the inner void Vb.

The bottom electrodes BE may be formed on the landing pads LP, respectively. The bottom electrodes BE may be disposed on the empty regions of the etch stop pattern 420c. The upper supporting pattern SS1 may be formed to support upper portions of lateral side surfaces of the bottom electrodes BE, and the lower supporting pattern SS2 may be formed to support lower portions of lateral side surfaces of the bottom electrodes BE. The dielectric layer DL may be formed to cover the bottom electrodes BE and the upper and lower supporting patterns SS1 and SS2, and the top electrode TE may be formed on the dielectric layer DL to fill a space between the bottom electrodes BE. The bottom electrodes BE, the dielectric layer DL, and the top electrode TE may constitute a capacitor CA.

The upper insulating pattern 500 on the peripheral region PR may be formed on the second filler pattern 410p. The upper insulating pattern 500 may cover the second filler pattern 410p. The etch stop pattern 420p may be further interposed between the upper insulating pattern 500 and the second filler pattern 410p. In an embodiment, the upper insulating pattern 500 may be formed to fill at least a portion of the inner void Vb.

Figure 16:
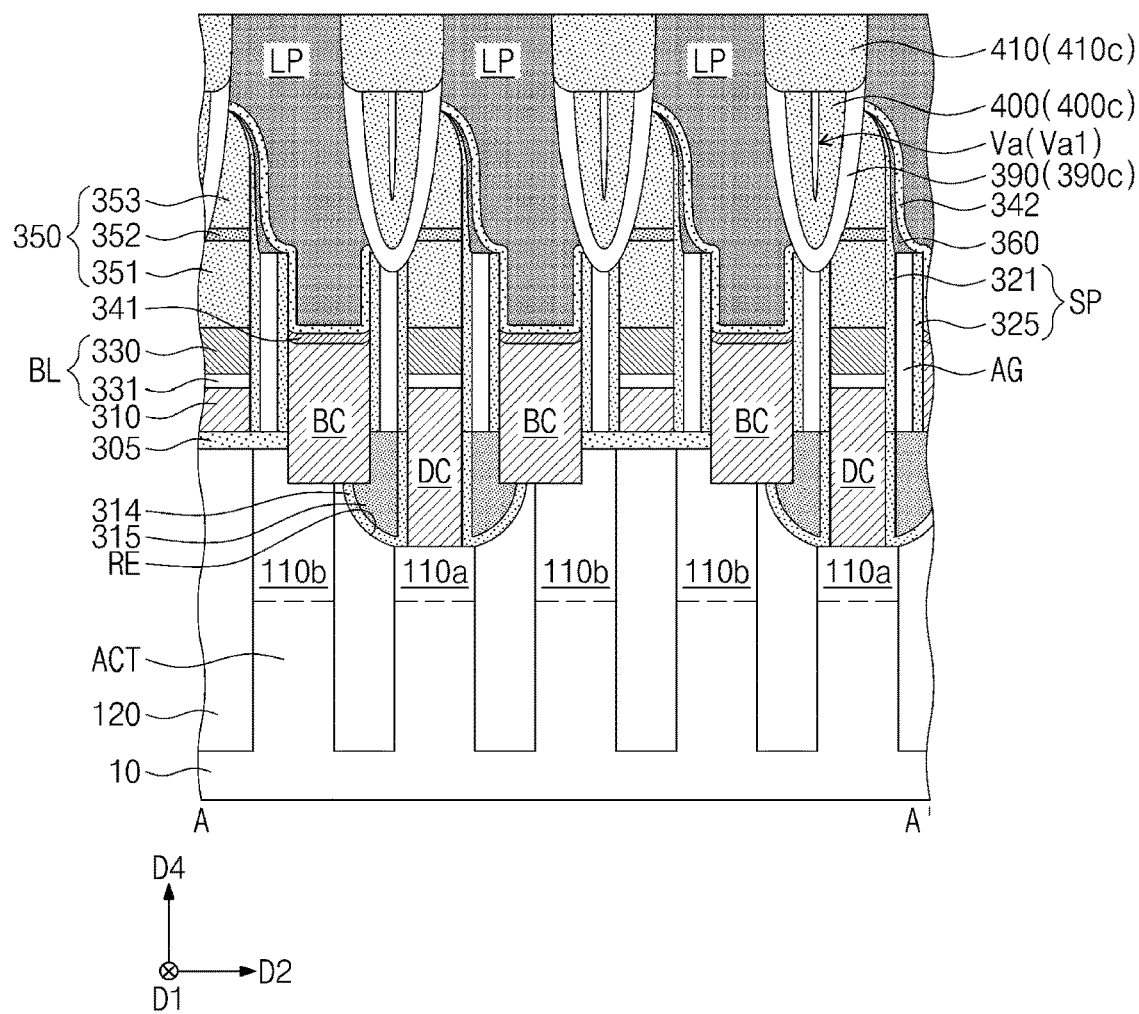
FIGS. 16 and 17 are cross-sectional views taken along the line A-A' of FIG. 14 to illustrate a method of fabricating a semiconductor device according to embodiments of the present inventive concept.
Figure 17:
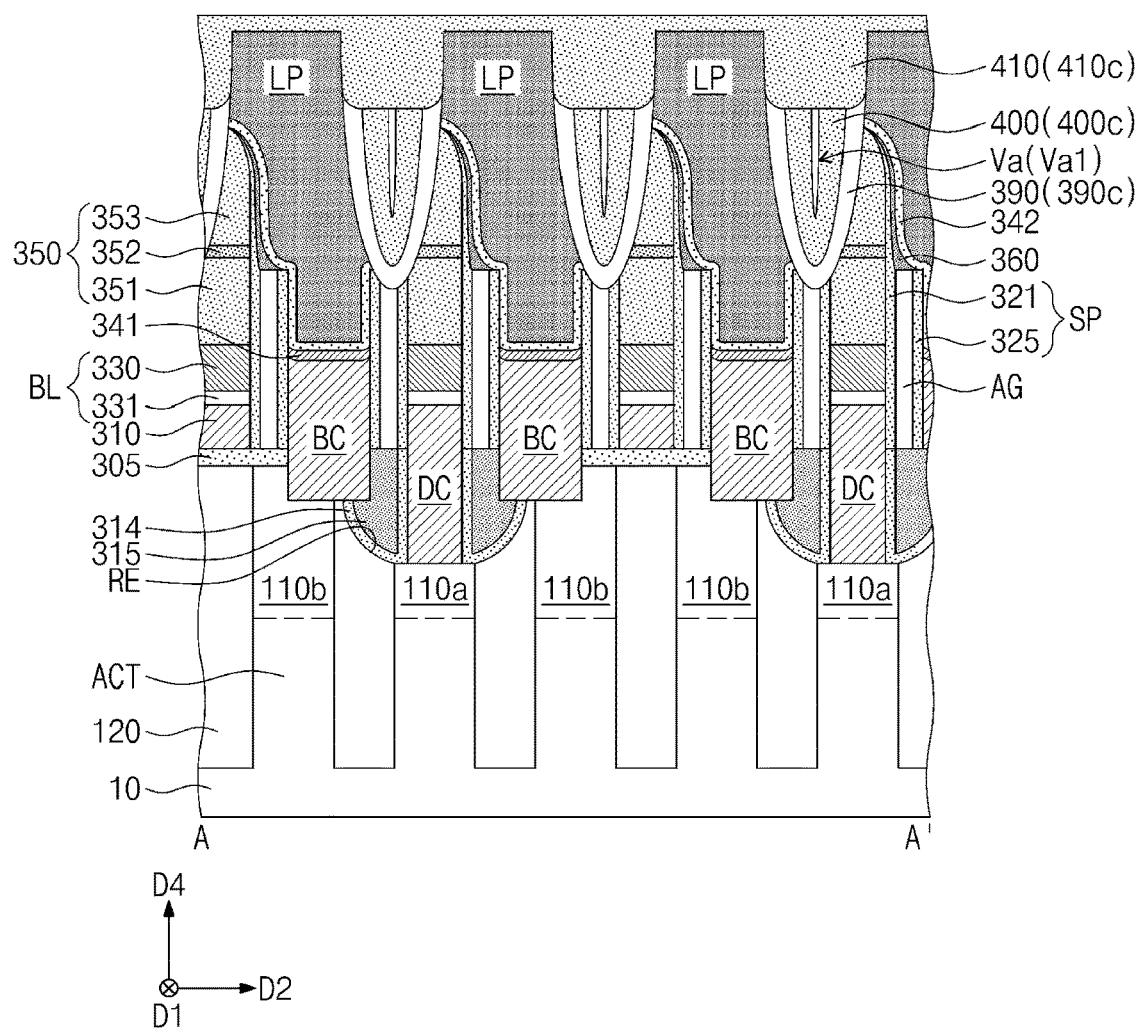

FIGS. 16 and 17 are cross-sectional views illustrating a portion of a process of fabricating a semiconductor device according to embodiments of the present inventive concept (e.g., an etching process performed on at least a portion of the upper portion of the second filler pattern 410c of FIG. 15A).

Referring to an embodiment of FIG. 16, an upper portion of the second filler pattern 410c on the cell region CR may be etched to expose the top surfaces of the landing pads LPs. After the etching process, a remaining portion of the second filler pattern 410c may be located at a same level or below the top surfaces of the landing pads LP. Thereafter, the etch stop pattern 420c of FIG. 3A may be formed on the second filler pattern 410c.

Referring to an embodiment of FIG. 17, an upper portion of the second filler pattern 410c on the cell region CR may be etched such that a portion of the second filler pattern 410c remains on an upper surface of the landing pads LP.

Thereafter, an etch stop layer may be further formed on the second filler pattern 410c and may be etched to form the etch stop pattern 420c of an embodiment of FIG. 3A. During the etching of the etch stop layer, portions of the second filler pattern 410c covering the top surfaces of the landing pads LPs may be further removed. For example, as a result of the formation of the etch stop pattern 420c, the top surfaces of the landing pads LPs may be exposed to the outside.

Alternatively, the etch stop layer may not be formed on the second filler pattern 410c. Thereafter, portions of the second filler pattern 414c covering the top surfaces of the landing pads LPs may be removed to expose the top surfaces of the landing pads LPs, and the capacitor CA may be formed on the landing pads LP.

In general, voids may be formed in a filler pattern, which is positioned between the landing pads LP and between the contact plugs CPLG. In this case, an etching solution, which is used in a process of forming the capacitor CA, may be supplied into patterns under the capacitor CA through the voids. Accordingly, the underlying pattern may be unintentionally etched, and this may lead to a decrease in reliability of the semiconductor device.

This problem may be overcome by forming the etch stop pattern 420 to a thickness that is thick enough to prevent the etching solution from being supplied into the underlying pattern. According to this method, it is however necessary to thickly form an etch stop layer on the top surfaces of the landing pads LP, and this may lead to a difficulty in forming the etch stop pattern 420 or etching the etch stop layer on the landing pads LP. As a result, it may be difficult to fully expose the top surfaces of the landing pads LP, and thus, the capacitor CA may not be electrically connected to the landing pads LP.

According to an embodiment of the present inventive concept, after the formation of the first filler pattern 400, an upper portion of the first filler pattern 400 may be etched, and the second filler pattern 410 may be formed to cover a remaining portion of the first filler pattern 400. For example, the second filler pattern 410 may be formed to cover the outer void Va, which is formed in the first filler pattern 400, or to prevent the outer voids Va from being exposed to the outside. Accordingly, it may be possible to prevent the etching solution from being supplied into the underlying patterns through the outer voids Va. The inner void Vb, which is enclosed by the second filler pattern 410, may be formed in the second outer void Va2, which is one of the outer voids Va, but the inner void Vb may have a size smaller than the second outer void Va2. Accordingly, it may be possible to prevent the unintended etching issue of the underlying pattern.

In addition, according to an embodiment of the present inventive concept, the second filler pattern 410p on the peripheral region PR may not be etched during a process of etching at least a portion of an upper portion of the second filler pattern 410c on the cell region CR. Accordingly, a thickness of the second filler pattern 410c on the landing pads LP may be smaller than a thickness of the second filler pattern 410p on the peripheral region PR. As a result, even when the second filler pattern 410p on the peripheral region PR is thickly formed to prevent the infiltration of the etching solution, due to the reduced thickness of the second filler pattern 410c on the cell region CR, it may be possible to more easily expose the top surfaces of the landing pads LP through an etching process. This may make it possible to provide a semiconductor device with increased reliability.

Furthermore, according to an embodiment of the present inventive concept, the etch stop pattern 420 may not be provided on the second filler pattern 410 by adjusting a thickness of the second filler pattern 410. As a result, an etching process of exposing the top surfaces of the landing pads LP may be more easily performed.

According to an embodiment of the present inventive concept, a second filler pattern may be provided to cover an outer void in a first filler pattern. Thus, it may be possible to prevent etching solution, which is used in a process of forming a capacitor, from being supplied into patterns under a capacitor through the outer void.

According to an embodiment of the present inventive concept, an etching process of exposing a top surface of a landing pad may be easily performed, and thus, it may be possible to electrically connect a capacitor to landing pads through top surfaces of the landing pads. As a result, the reliability of the semiconductor device may be increased.

While non-limiting, example embodiments of the present inventive concept have been particularly shown and described, it will be understood by one of ordinary skill in the art that variations in form and detail may be made therein without departing from the spirit and scope of the present inventive concept.

What is claimed is:

1. A semiconductor device, comprising:
a substrate including a cell region and a peripheral region;
landing pads disposed on the cell region and spaced apart from each other in first and second directions that are parallel to a top surface of the substrate and are non-parallel to each other;
contact plugs disposed on the peripheral region and spaced apart from each other in the first and second directions;
a first filler pattern arranged to fill regions between the landing pads and between the contact plugs;
outer voids disposed in the first filler pattern, the outer voids comprising a first outer void on the cell region and a second outer void on the peripheral region;
a second filler pattern arranged to cover the first filler pattern and the contact plugs and to fill at least a portion of the second outer void; and
an inner void positioned in the second outer void and enclosed by the second filler pattern,
wherein the first filler pattern comprises a same material as the second filler pattern,
at least a portion of the second filler pattern on the cell region is located at a level lower than top surfaces of the landing pads, and
a portion of a bottom surface of the second filler pattern on the cell region is exposed by the first outer void.

2. The semiconductor device of claim 1, further comprising an upper insulating pattern disposed on the second filler pattern,
wherein a portion of the upper insulating pattern is arranged to fill at least a portion of the inner void.

3. The semiconductor device of claim 1, wherein the first filler pattern and the second filler pattern comprise silicon nitride.

4. The semiconductor device of claim 1, wherein a top surface of the second filler pattern disposed on the cell region is located at a level that is lower than a top surface of the second filler pattern disposed on the peripheral region.

5. The semiconductor device of claim 1, wherein the second filler pattern further comprises a protruding portion that is disposed on the cell region and is located at a level that is higher than a level of the top surfaces of the landing pads.

6. The semiconductor device of claim 1, further comprising an etch stop pattern covering the second filler pattern.

7. The semiconductor device of claim 6, wherein the etch stop pattern comprises SiBN.

8. The semiconductor device of claim 6, wherein a top surface of the etch stop pattern on the cell region is located at a level lower than a level of a top surface of the etch stop pattern on the peripheral region.

9. The semiconductor device of claim 6, wherein a portion of the etch stop pattern on the peripheral region is arranged to fill at least a portion of the inner void.

10. The semiconductor device of claim 1, wherein the first outer void is an empty region positioned in the first filler pattern.

* * * * *